US012787501B2

(12) United States Patent
Kadowaki et al.

(10) Patent No.: US 12,787,501 B2
(45) Date of Patent: Nov. 3, 2026

(54) SEMICONDUCTOR ELEMENT AND MANUFACTURING METHOD FOR SEMICONDUCTOR ELEMENT

(71) Applicant: NICHIA CORPORATION, Anan (JP)

(72) Inventors: Takuya Kadowaki, Yokohama (JP); Tadashi Kawazoe, Atsugi (JP)

(73) Assignee: NICHIA CORPORATION, Anan (JP)

( * ) Notice: Subject to any disclaimer, the term of this patent is extended or adjusted under 35 U.S.C. 154(b) by 556 days.

(21) Appl. No.: 18/260,980

(22) PCT Filed: Jan. 11, 2022

(86) PCT No.: PCT/JP2022/000597

§ 371 (c)(1),
(2) Date: Jul. 11, 2023

(87) PCT Pub. No.: WO2022/153983

PCT Pub. Date: Jul. 21, 2022

(65) Prior Publication Data

US 2024/0322074 A1 Sep. 26, 2024

(30) Foreign Application Priority Data

Jan. 12, 2021 (JP) ................................. 2021-002957
Mar. 16, 2021 (JP) ................................. 2021-042844

(51) Int. Cl.
*H10H 20/81* (2025.01)
*H10H 20/01* (2025.01)

(52) U.S. Cl.
CPC ...... *H10H 20/8215* (2025.01); *H10H 20/014* (2025.01)

(58) Field of Classification Search
CPC .............. H10H 20/014; H10H 20/8262; H10F 30/221; H10F 77/206
See application file for complete search history.

(56) References Cited

U.S. PATENT DOCUMENTS

2016/0149070 A1 5/2016 Kajiyama et al.
2019/0097384 A1 3/2019 Tsuda
2020/0409186 A1 12/2020 Kadowaki et al.

FOREIGN PATENT DOCUMENTS

JP 2012-169565 A 9/2012
JP 2015-012047 A 1/2015
(Continued)

OTHER PUBLICATIONS

Ohtsu, M. , and Kawazoe, T. . "Principles and practices of Si light emitting diodes using dressed photons", Advanced Materials Letters, 10, 12, 2019, 860-867. doi: 10.5185/amlett.2019.2264 (Year: 2019).*

(Continued)

*Primary Examiner* — Matthew L Reames
(74) *Attorney, Agent, or Firm* — Foley & Lardner LLP

(57) ABSTRACT

A method of manufacturing a semiconductor element includes: providing a semiconductor stack including: a silicon substrate containing a first impurity of a first conductivity type that is one of p-type and n-type, at a first concentration, and a silicon semiconductor layer provided on the silicon substrate, the silicon semiconductor layer including: a first silicon semiconductor layer containing a second impurity of the first conductivity type at a second concentration that is lower than the first concentration, and a second silicon semiconductor layer containing a third impurity of a second conductivity type that is the other of p-type and n-type; and irradiating the silicon semiconductor layer with light having a predetermined peak wavelength in a presence of a forward current flowing through the silicon semiconductor layer such that the third impurity is diffused. The predetermined peak wavelength is longer than a wavelength corresponding to a magnitude of a bandgap of silicon.

13 Claims, 15 Drawing Sheets

(56) References Cited

FOREIGN PATENT DOCUMENTS

| | | | |
|---|---|---|---|
| JP | 2017-050302 | A | 3/2017 |
| JP | 2018-006496 | A | 1/2018 |
| JP | 2019-057692 | A | 4/2019 |
| JP | 2021-004909 | A | 1/2021 |
| WO | WO-2014/208186 | A1 | 12/2014 |
| WO | WO-2020/065736 | A1 | 4/2020 |

OTHER PUBLICATIONS

International Search Report with English language translation and Written Opinion of the International Searching Authority issued in the corresponding International Patent Application No. PCT/JP2022/000597, dated Apr. 5, 2022.

Tran, Minh Anh et al., "Fabrication of a bulk silicon p-n homojunction-structured light-emitting diode showing visible electroluminescence at room temperature", Applied Physics A, vol. 15, pp. 105-111, 2014, DOI 10.1007/s00339-013-7907-9.

* cited by examiner

SEMICONDUCTOR ELEMENT AND MANUFACTURING METHOD FOR SEMICONDUCTOR ELEMENT

CROSS-REFERENCE TO RELATED APPLICATION

This application is a national stage application of International Application No. PCT/JP2022/000597 filed on Jan. 11, 2022, which claims priority to Japanese Patent Application No. 2021-002957 filed on Jan. 12, 2021, and Japanese Patent Application No. 2021-042844 filed on Mar. 16, 2021, the disclosures of which are hereby incorporated by reference in their entireties.

TECHNICAL FIELD

The present disclosure relates to a semiconductor element and a manufacturing method for a semiconductor element.

BACKGROUND

One of the methods of manufacturing semiconductor elements containing silicon is a special annealing method called dressed photon phonon-assisted annealing (hereinafter, referred to as "DPP annealing"). Japanese Patent Publication No. 2015-012047 discloses an example of the method of manufacturing a photodetector containing silicon using DPP annealing.

SUMMARY

There is a need for novel semiconductor elements that operate using dressed photons and methods of manufacturing such semiconductor elements.

According to one embodiment, a semiconductor element manufacturing method of the present disclosure includes: providing a semiconductor stack including a silicon substrate and a silicon semiconductor layer provided on the silicon substrate, the silicon substrate containing a first impurity of a first conductivity type that is one of p-type and n-type, at a first concentration, the silicon semiconductor layer including a first silicon semiconductor layer and a second silicon semiconductor layer, the first silicon semiconductor layer containing a second impurity of the first conductivity type at a second concentration that is lower than the first concentration, the second silicon semiconductor layer containing a third impurity of a second conductivity type that is the other of p-type and n-type; and irradiating the silicon semiconductor layer with light having a predetermined peak wavelength in a presence of a forward current flowing through the silicon semiconductor layer such that the third impurity is diffused.

According to one embodiment, a semiconductor element of the present disclosure includes: a silicon substrate containing a first impurity of a first conductivity type that is one of p-type and n-type, at a first concentration; and a silicon semiconductor layer provided on the silicon substrate. The silicon semiconductor layer includes a first silicon semiconductor layer and a second silicon semiconductor layer in this order from the silicon substrate side. The first silicon semiconductor layer contains a second impurity of the first conductivity type at a second concentration that is lower than the first concentration. The second silicon semiconductor layer contains a third impurity of a second conductivity type that is the other of p-type and n-type. The silicon semiconductor layer includes a pn junction located between the first silicon semiconductor layer and the second silicon semiconductor layer. In a region including the pn junction, the semiconductor element has a photosensitivity for light whose peak wavelength is longer than a wavelength corresponding to a magnitude of a bandgap of silicon, or the semiconductor element emits light whose peak wavelength is longer than the wavelength corresponding to the magnitude of the bandgap of silicon.

According to embodiments of the present disclosure, novel semiconductor elements that operate using dressed photons and methods of manufacturing such semiconductor elements can be realized.

BRIEF DESCRIPTION OF DRA/WINGS

Figure 1A:
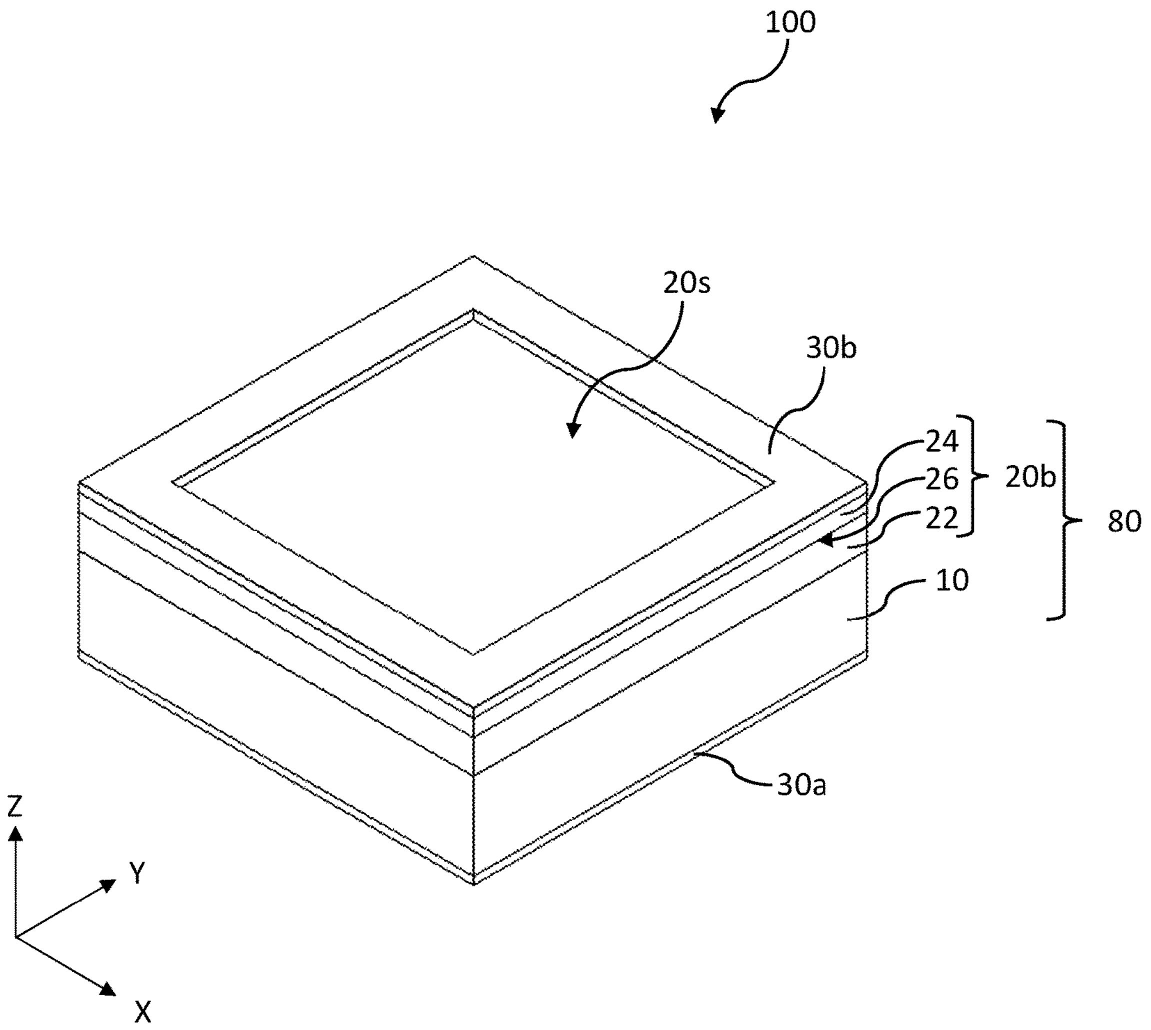
FIG. 1A is a perspective view schematically showing a configuration example of a semiconductor element according to an embodiment of the present disclosure.

DETAILED DESCRIPTIONS (General Description of Dressed Photon Phonon-Assisted Annealing)

Hereinafter, the principles of DPP annealing are described, although many aspects of dressed photons have not yet been elucidated, and the description includes hypotheses. DPP annealing is the method of irradiating a semiconductor containing impurities with light having a predetermined peak wavelength in the presence of a forward current flowing through the semiconductor containing impurities. This DPP annealing enables manufacture of semiconductor elements with the use of dressed photons, which are one kind of near-field light, or a state called "dressed photon phonon", which results from interaction between dressed photons and coherent phonons. When a forward current is supplied, the impurities are diffused by Joule heat. Also, dressed photon phonons occur around impurity atoms, and the semiconductor uses carriers obtained from the supplied current to cause stimulated emission of light corresponding to the peak wavelength of the irradiation light. Therefore, the electrical energy provided from the supplied current to the semiconductor is converted to the thermal energy in the form of Joule heat and to the optical energy in the form of stimulated emission light. Dissipation of the optical energy in the form of stimulated emission light to the outside means that the electrical energy is partially consumed as the optical energy and the impurity atoms are cooled. Diffusion of the cooled impurity atoms can be suppressed, and the impurity atoms can be distributed in a self-organizing manner at positions corresponding to the light applied for irradiation, which has the predetermined peak wavelength. This DPP annealing can be used for, for example, manufacture of semiconductor light-emitting elements and semiconductor photodetectors. DPP-annealed semiconductor light-emitting elements are capable of emitting light even if, for example, the semiconductor material of the semiconductor elements is an indirect transition semiconductor. DPP-annealed photodetectors are capable of receiving light at a shorter wavelength than the bandgap of the semiconductor material of the semiconductor elements.

Hereinafter, with reference to the drawings, a semiconductor element and a method of manufacturing the semiconductor element according to embodiments of the present disclosure are described in detail. The same reference characters in a plurality of drawings denote the same or similar parts.

The description below is intended to give a concrete form to the technical ideas of the present invention, but the scope of the present invention is not intended to be limited thereto. The size, material, shape, relative arrangement, etc., of the components are intended as examples, and the scope of the present invention is not intended to be limited thereto. The size, arrangement relationship, etc., of the members shown in each drawing may be exaggerated in order to facilitate understanding.

In the specification and claims herein, moreover, when there are multiple pieces of a certain component and a distinction must be made, an ordinal such as "first," "second," or the like might occasionally be added. When the specification and the claims are based on different distinctions or standpoints, an element accompanied by the same ordinal might not refer to the same element between the specification and the claims.

EMBODIMENTS

<Semiconductor Element>

Firstly, a basic configuration example of a semiconductor element according to an embodiment of the present disclosure is described with reference to FIG. 1A and FIG. 1B.

FIG. 1A is a perspective view schematically showing a configuration example of a semiconductor element 100 according to an embodiment of the present disclosure. FIG. 1B is a cross-sectional view of the semiconductor element 100 shown in FIG. 1A, which is parallel to the XZ plane. In the attached drawings, for the sake of reference, X, Y and Z axes that are perpendicular to one another are schematically shown. In this specification, for the sake of clarity in description, the direction of the arrow of Z axis is referred to as "upper." A part located on the upper side is referred to as "upper part." This does not limit the orientation of the semiconductor element 100 when used, but the semiconductor element 100 can have an arbitrary orientation when used.

The semiconductor element 100 of the present embodiment includes a silicon substrate 10 and a silicon semiconductor layer 20*b* provided on the silicon substrate 10. The semiconductor element 100 of the present embodiment can operate as a photodetector that is capable of efficiently detecting light at a longer wavelength than wavelength $\lambda_g$=0.1 μm, which corresponds to the magnitude of the bandgap of silicon, 1.1 eV. The light at a longer wavelength than wavelength $\lambda_g$ can be, for example, infrared light at the wavelength of equal to or longer than 1.1 μm and equal to or shorter than 4.0 μm. The semiconductor element 100 of the present embodiment can also operate as a light-emitting element that is capable of efficiently emitting light at a longer wavelength than wavelength $\lambda_g$. The semiconductor element 100 of the present embodiment can also operate as a temperature sensor that uses thermal radiation at a longer wavelength than wavelength $\lambda_g$.

In the present embodiment, the silicon semiconductor layer 20*b* has a surface 20*s* that is parallel to the XY plane. When the semiconductor element 100 is used as a photodetector, the surface 20*s* is a light receiving surface. When the semiconductor element 100 is used as a light-emitting element, the surface 20*s* is a light emitting surface. When the semiconductor element 100 is used as a temperature sensor, the surface 20*s* is a temperature measuring surface.

The semiconductor element 100 of the present embodiment includes a second lower electrode 30*a* and a second upper electrode 30*b*, which are used in the operation of the photodetector, light-emitting element or temperature sensor. The second lower electrode 30*a* and the second upper electrode 30*b* can be used when the semiconductor element is in operation. The second lower electrode 30*a* is provided on a surface of the silicon substrate 10 which is opposite to the surface on which the silicon semiconductor layer 20*b* is provided. The second upper electrode 30*b* is provided on at least a part of the surface 20*s* so as not to interrupt the operation. In the example shown in FIG. 1A, the second upper electrode 30*b* is provided on a peripheral region of the surface 20*s*. When the semiconductor element 100 is used as a photodetector or light-emitting element, the second upper electrode 30*b* may be provided over the entirety of the surface 20*s* so long as the second upper electrode 30*b* is a light-transmitting electrode. In this specification, "light-transmitting" means that the transmittance for infrared light at the wavelength of equal to or longer than 1.1 μm and equal to or shorter than 2.0 μm is 60% or higher.

The semiconductor element 100 of the present embodiment can include, in addition to the constituents shown in FIG. 1A, for example, an interconnection layer electrically connected to the second lower electrode 30*a* and the second upper electrode 30*b*, and other circuit elements.

Hereinafter, the configuration of the silicon substrate 10 and the silicon semiconductor layer 20*b* is described. The crystals of the silicon substrate 10 and the silicon semiconductor layer 20*b*, the impurities for doping these constituents, and the dimensions of these constituents will be described later in the description of the method of manufacturing the semiconductor element 100.

The silicon substrate 10 has the first impurity of the first conductivity type, which is one of p-type and n-type, at the first concentration.

The silicon semiconductor layer 20*b* is provided on the silicon substrate 10. As shown in FIG. 1A, the silicon semiconductor layer 20*b* includes a first silicon semiconductor layer 22 and a second silicon semiconductor layer 24 in this order from the silicon substrate 10 side. The first silicon semiconductor layer 22 contains the second impurity of the first conductivity type at the second concentration that is lower than the first concentration. The second silicon semiconductor layer 24 contains the third impurity of the second conductivity type that is the other of p-type and n-type. The silicon semiconductor layer 20*b* further includes a pn junction 26 (at the interface) between the first silicon semiconductor layer 22 and the second silicon semiconductor layer 24.

Figure 1B:
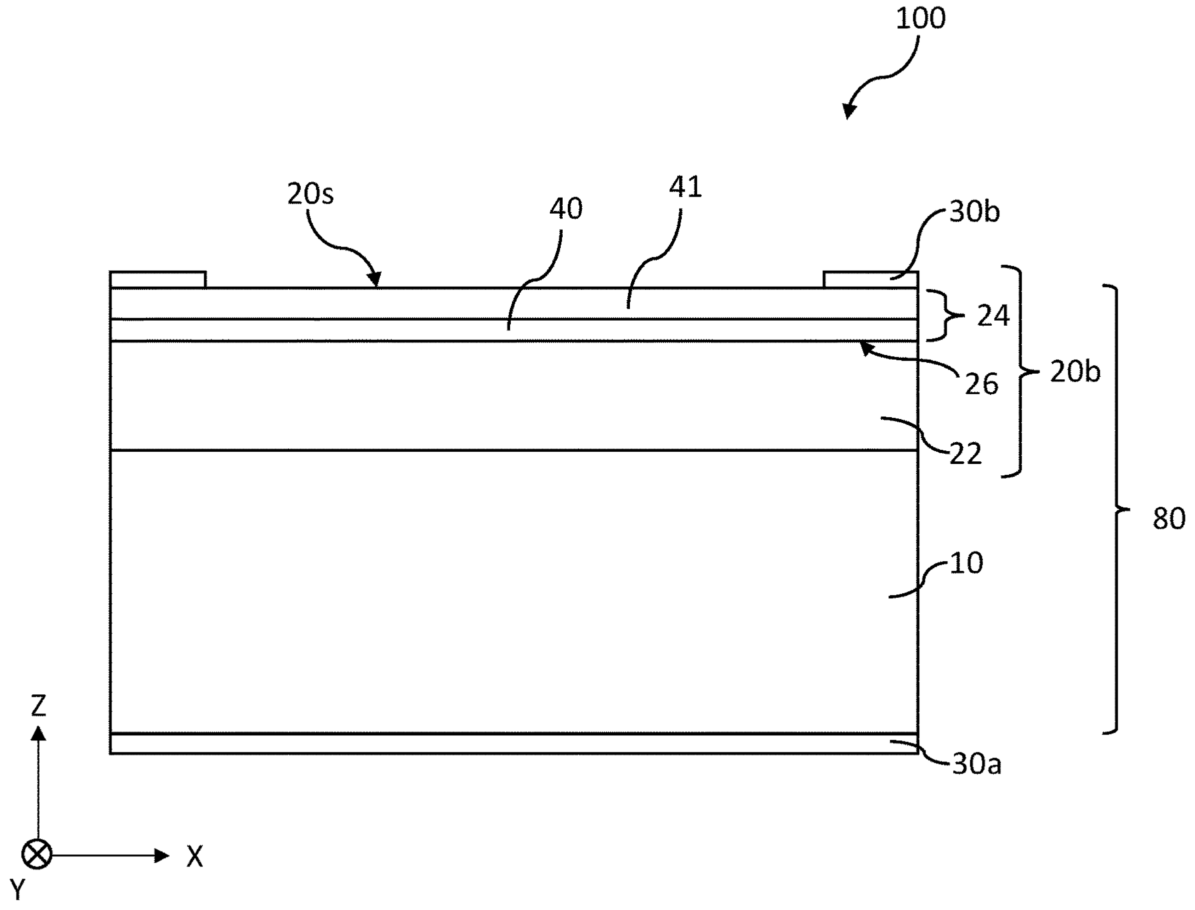
FIG. 1B is a cross-sectional view of the semiconductor element shown in FIG. 1A, which is parallel to the XZ plane.

As shown in FIG. 1B, the second silicon semiconductor layer 24 includes a near-field light formation region 40. The near-field light formation region 40 is also referred to as the first region. The near-field light formation region 40 is formed along the pn junction 26 by DPP annealing. DPP annealing is performed by irradiating the silicon semiconductor layer 20*b* with light having a predetermined peak wavelength in the presence of a forward current flowing through the silicon semiconductor layer 20*b*. The light that has the predetermined peak wavelength can be light whose peak wavelength is longer than wavelength $\lambda_g$. Details of DPP annealing will be described later. As shown in FIG. 1B, the second silicon semiconductor layer 24 also includes a second region 41. That is, the second silicon semiconductor layer 24 includes the first region (near-field light formation region 40) and the second region 41.

The near-field light formation region 40 includes part of a region including the third impurity included in the second silicon semiconductor layer 24, which is at least irradiated with light in DPP annealing. The near-field light occurs around the third impurity which forms the pn junction. The size of the third impurity is on an atomic-level order, and it is expected that dressed photons and dressed photon phonons are likely to be generated.

When light is incident on the near-field light formation region 40, near-field light is formed. The energy of the incident light is lower than, for example, the energy corresponding to wavelength $\lambda_g$, i.e., the energy of the bandgap of silicon. On the other hand, the energy of the dressed photon phonons can be the energy that compensates for the difference between the energy of the bandgap of silicon and the energy of the incident light. That is, the dressed photon phonons can form an energy level equivalent to the intermediate level within the bandgap of silicon by the interaction between dressed photons and coherent phonons. Also, the dressed photon phonons can exchange the momentum with electrons. Therefore, the dressed photon phonons can compensate for the energy and the momentum. By the intermediation of the dressed photon phonons, the electrons in the near-field light formation region 40 and the vicinity thereof, specifically the electrons in the depletion layer region that includes the pn junction 26, can have photosensitivity for light at a longer wavelength than wavelength $\lambda_g$. A predetermined region including the pn junction 26 is capable of emitting light at a longer wavelength than wavelength $\lambda_g$.

<Method of Manufacturing a Semiconductor Element>

Next, an example of the method of manufacturing a semiconductor element according to the present embodiment is described with reference to FIG. 2A to FIG. 2H. FIG. 2A to FIG. 2H are diagrams for illustrating an example of the steps in the method of manufacturing a semiconductor element according to the present embodiment. According to the semiconductor element manufacturing method of the present disclosure, in one embodiment, a semiconductor wafer including a plurality of semiconductor element portions is divided into individual chips, whereby separate semiconductor elements can be manufactured. For the sake of simplicity, FIG. 2A to FIG. 2H schematically show a portion corresponding to a single semiconductor element. In the following description, the dimension in Z direction is referred to as "thickness".

The semiconductor element manufacturing method according to the present embodiment includes: providing a semiconductor stack including a silicon substrate and a silicon semiconductor layer provided on the silicon substrate, the silicon substrate containing a first impurity of a first conductivity type that is one of p-type and n-type, at a first concentration, the silicon semiconductor layer including a first silicon semiconductor layer and a second silicon semiconductor layer, the first silicon semiconductor layer containing a second impurity of the first conductivity type at a second concentration that is lower than the first concentration, the second silicon semiconductor layer containing a third impurity of a second conductivity type that is the other of p-type and n-type; and irradiating the silicon semiconductor layer with light having a predetermined peak wavelength in the presence of a forward current flowing through the silicon semiconductor layer such that the third impurity is diffused. The step of providing the semiconductor stack may include providing a silicon substrate containing a first impurity of a first conductivity type that is one of p-type and n-type, at a first concentration; forming a silicon semiconductor layer on the silicon substrate, the silicon semiconductor layer including a first silicon semiconductor layer containing a second impurity of the first conductivity type at a second concentration that is lower than the first concentration; and introducing, into a surface of the silicon semiconductor layer, a third impurity of a second conductivity type that is the other of p-type and n-type, thereby forming a second silicon semiconductor layer.

<Step of Providing the Silicon Substrate 10>

Figure 2A:
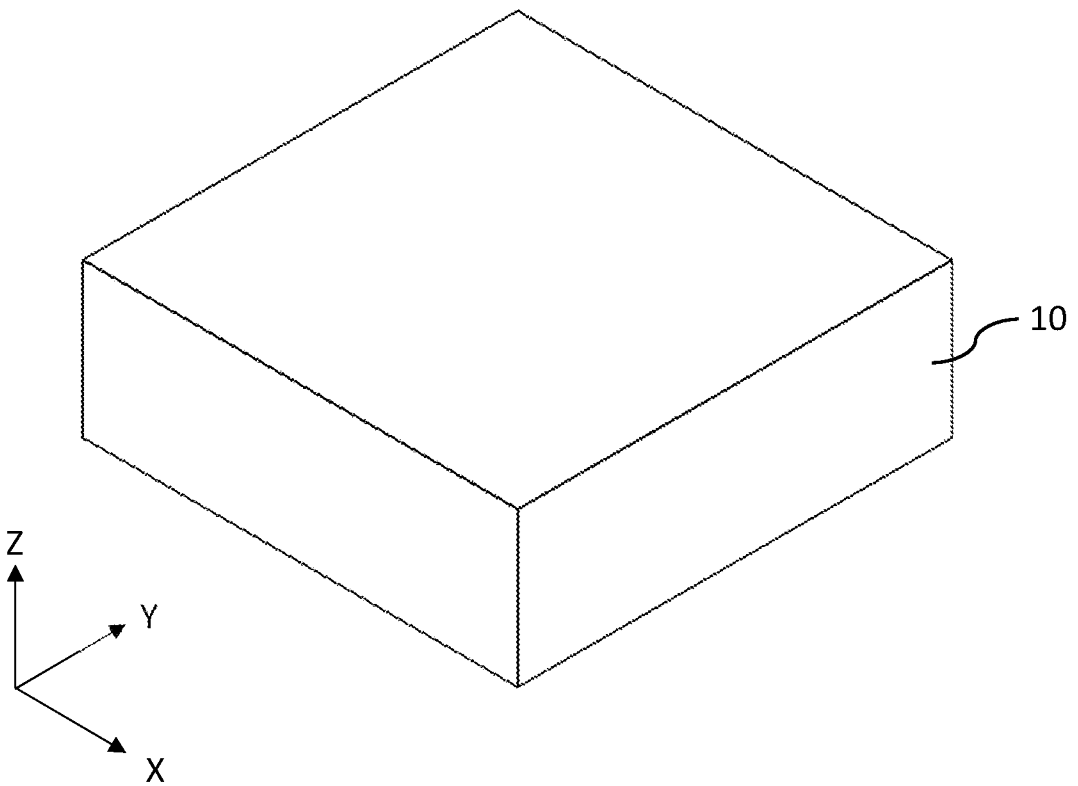
FIG. 2A is a diagram for illustrating an example of a step in a method of manufacturing a semiconductor element according to the present embodiment.

As shown in FIG. 2A, the silicon substrate 10 is provided. The silicon substrate 10 is preferably monocrystalline. In this case, in the step of forming the silicon semiconductor layer 20*b*, which will be described later, the formed silicon semiconductor layer 20*b* can have a crystal orientation. The silicon substrate 10 is, for example, a n-type monocrystalline silicon substrate having a (100) plane. The surface of the silicon substrate 10 may have a crystal plane other than the (100) plane. The silicon substrate 10 contains the first impurity of the first conductivity type, which is one of p-type and n-type, at the first concentration. The distribution of the first impurity inside the silicon substrate 10 is not particularly limited but is preferably uniform. In this case, the electrical resistivity of the entire silicon substrate 10 is low and, when DPP annealing is performed, Joule heat is unlikely to be generated in the silicon substrate 10. Also, heat dissipation to the outside is easy. The first impurity is, for example, at least one type of atom selected from the group consisting of phosphorus (P) atom, arsenic (As) atom, antimony (Sb) atom, boron (B) atom, and aluminum (Al) atom. The first concentration is, for example, equal to or higher than $1.0\times10^{17}$ $cm^{-3}$ and equal to or lower than $1.0\times10^{21}$ $cm^{-3}$, preferably equal to or higher than $1.0\times10^{18}$ $cm^{-3}$ and equal to or lower than $1.0\times10^{20}$ $cm^{-3}$. In this case, the electrical resistivity of the silicon substrate 10 can be reduced, and electrical connection with the electrode can be easily established. Note that the first concentration and the second and third concentrations, which will be described later, can be analyzed by Secondary Ion Mass Spectroscopy (SIMS). The electrical resistivity of the silicon substrate 10 is, for example, equal to or higher than $1.0\times10^{-4}$ Ωcm and equal to or lower than $1\times10^{-1}$ Ωcm, preferably equal to or higher than $2\times10^{-3}$ Ωcm and equal to or lower than $1\times10^{-2}$ Ωcm. In this step, the thickness of the silicon substrate 10 can be equal to or greater than 100 μm and equal to or smaller than 800 μm. In a step described below, the silicon substrate 10 can be processed such that the thickness is reduced.

<Step of Forming the Silicon Semiconductor Layer 20*a*>

Figure 2B:
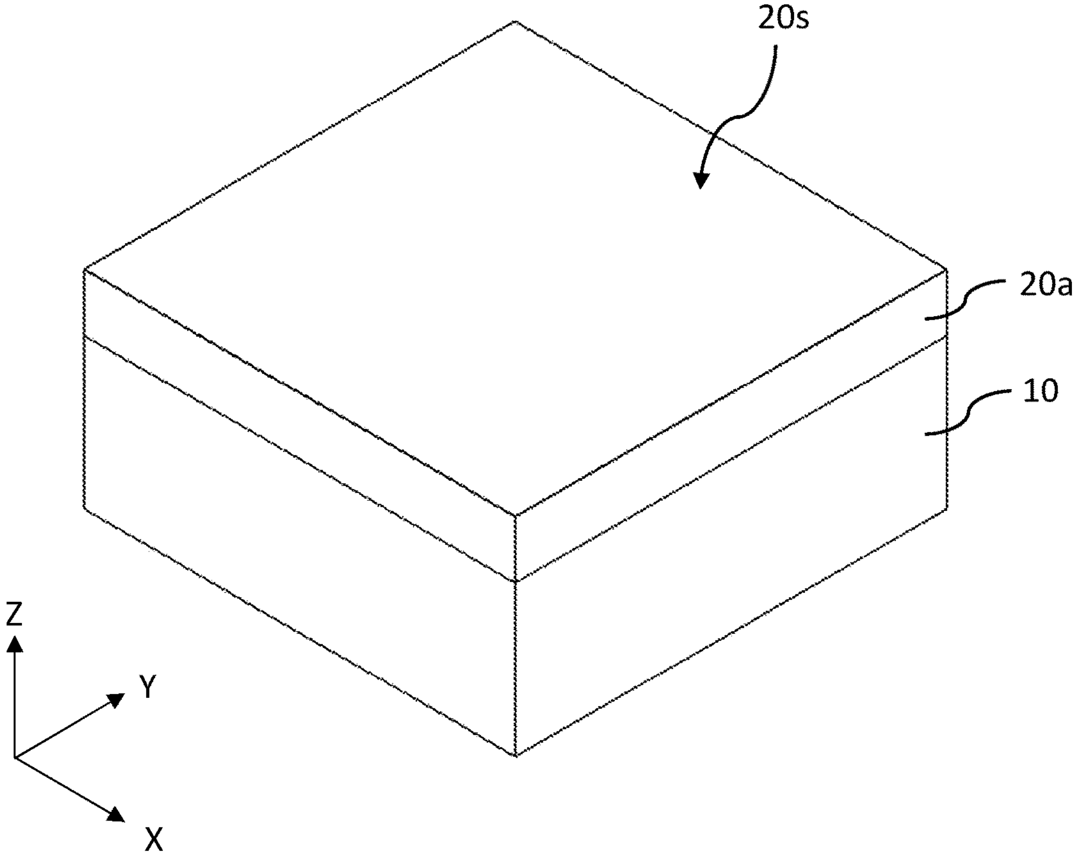
FIG. 2B is a diagram for illustrating an example of a step in a method of manufacturing a semiconductor element according to the present embodiment.

In a subsequent step, a silicon semiconductor layer 20*a* is formed on the silicon substrate 10 as shown in FIG. 2B. The silicon semiconductor layer 20*a* can be formed by, for example, Chemical Vaper Deposition (CVD). The silicon semiconductor layer 20*a* can be formed by introducing a carrier gas and a source gas into a furnace. The carrier gas can be, for example, a hydrogen ($H_2$) gas. The source gas for Si can be, for example, a silane ($SiH_4$) gas, silicon tetrachloride ($SiCl_4$) gas, or dichlorosilane ($SiH_2Cl_2$). The silicon semiconductor layer 20*a* is, for example, monocrystalline or polycrystalline. The silicon semiconductor layer 20*a* may have a crystal orientation. That is, as for the crystals that are constituents of the silicon semiconductor layer 20*a*, at least one of a plurality of crystal axes of silicon may be aligned in a single direction. The silicon semiconductor layer 20*a* is preferably a silicon epitaxial semiconductor layer, which is realized by epitaxial growth of silicon. The silicon epitaxial semiconductor layer can be formed by, for example, epitaxial growth using the (100) plane of the monocrystalline silicon substrate 10 as a crystal growth plane. The [100] axis of silicon in the silicon epitaxial semiconductor layer is perpendicular to the crystal growth plane. Each of the other crystal axes than the [100] axis is also aligned in a single direction. Note that, however, in the present embodiment, when the silicon semiconductor layer 20*a* is polycrystalline, so long as one of the plurality of crystal axes of silicon in each crystal grain (e.g., [100] axis) is aligned in a single direction, each of the other crystal axes does not need to be aligned in a single direction. The orientation direction of the silicon semiconductor layer 20*a* is not limited to the [100] axis. When the silicon semiconductor layer 20*a* is polycrystalline, the size of individual crystal grain can be, for example, 10 nm or greater.

The silicon semiconductor layer 20*a* contains the second impurity of the first conductivity type, which is one of p-type and n-type, at the second concentration that is lower than the first concentration. The second impurity is, for example, uniformly distributed in the silicon semiconductor layer 20*a*. The second impurity can be, for example, at least one type of atom selected from the group consisting of phosphorus (P) atom, arsenic (As) atom, antimony (Sb) atom, boron (B) atom, and aluminum (Al) atom. When the first conductivity type is n-type, the second impurity is preferably arsenic (As) atom or antimony (Sb) atom. Arsenic (As) atom or antimony (Sb) atom is a relatively heavy element as the dopant for silicon and can realize a great relative density with respect to the third impurity of the second silicon semiconductor layer 24, which will be described later. Thus, the emission intensity or photosensitivity of the semiconductor element can be improved. The second concentration is lower than the first concentration. Thus, in DPP annealing described below, Joule heat is concentrated in the first silicon semiconductor layer 22 rather than the silicon substrate 10, so that the third impurity can be distributed in a self-organizing manner. The second concentration is, for example, equal to or higher than $1.0\times10^{14}$ $cm^{-3}$ and equal to or lower than $1.0\times10^{16}$ $cm^{-3}$, preferably equal to or higher than $5\times10^{4}$ $cm^{-3}$ and equal to or lower than $1\times10^{16}$ $cm^{-3}$. The electrical resistivity of the silicon semiconductor layer 20*a* is, for example, equal to or higher than 1.0 Ωcm and equal to or lower than 100 Ωcm, preferably equal to or higher than 1 Ωcm and equal to or lower than 10 Ωcm. The dimensions in X direction and Y direction of the silicon semiconductor layer 20*a* are, respectively, substantially equal to the dimensions in X direction and Y direction of the silicon substrate 10. The thickness of the silicon semiconductor layer 20*a* can be, for example, equal to or greater than 2 μm and equal to or smaller than 10 μm.

In actuality, in the vicinity of the interface between the silicon substrate 10 and the silicon semiconductor layer 20*a*, there can be a diffusion region where the impurity is diffused from one of the silicon substrate 10 and the silicon semiconductor layer 20*a* to the other. The thickness of the diffusion region can be equal to or greater than 1 μm and equal to or smaller than 4 μm.

<Step of Forming the First Silicon Semiconductor Layer and the Second Silicon Semiconductor Layer>

Figure 2C:
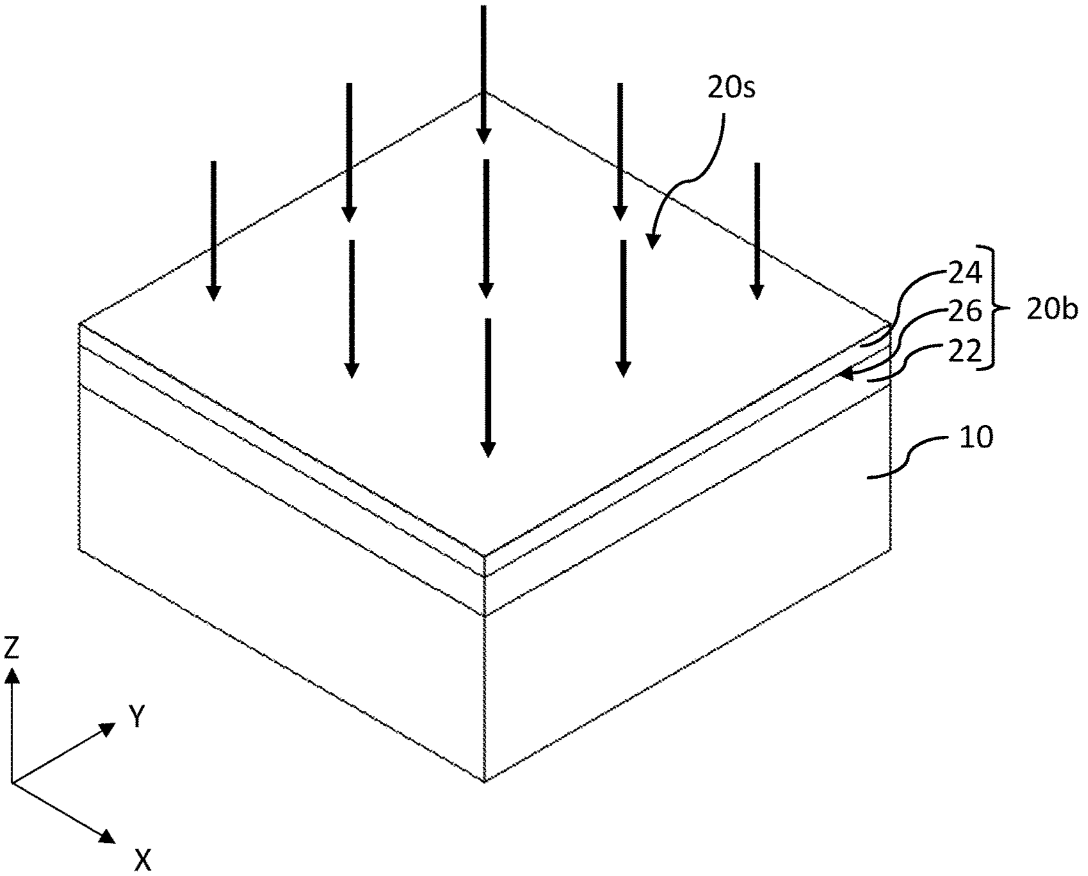
FIG. 2C is a diagram for illustrating an example of a step in a method of manufacturing a semiconductor element according to the present embodiment.

In a subsequent step, as shown in FIG. 2C, the third impurity of the second conductivity type that is the other of p-type and n-type is introduced into the surface 20*s* of the silicon semiconductor layer 20*a*. The introduction of the third impurity is performed by, for example, an ion implantation method in which ions of the third impurity are accelerated and implanted into the surface 20*s* of the silicon semiconductor layer 20*a*. In FIG. 2C, the downward arrows schematically show ion implantation of the third impurity of the second conductivity type. According to this ion implantation method, the third impurity is implanted into a part of the silicon semiconductor layer 20*a*, whereby the silicon semiconductor layer 20*b* can be formed. As shown in FIG. 2C, the silicon semiconductor layer 20*b* includes the first silicon semiconductor layer 22 of the first conductivity type and the second silicon semiconductor layer 24 of the second conductivity type. The first silicon semiconductor layer 22 includes a part of the silicon semiconductor layer 20*b* which does not contain the third impurity and a part of the silicon semiconductor layer 20*b* in which the concentration of the second impurity is higher than the concentration of the third impurity. The second silicon semiconductor layer 24 is a part of the silicon semiconductor layer 20*b* in which the concentration of the third impurity is higher than the concentration of the second impurity. Between the first silicon semiconductor layer 22 and the second silicon semiconductor layer 24, a pn junction is formed. The thickness of the first silicon semiconductor layer 22 can be, for example, equal to or greater than 2 μm and equal to or smaller than 10 μm. The thickness of the second silicon semiconductor layer 24 can be, for example, equal to or greater than 1 μm and equal to or smaller than 2 μm.

The impurity concentration and the electrical resistivity of the first silicon semiconductor layer 22 are substantially equal to the impurity concentration and the electrical resistivity of the silicon semiconductor layer 20*a* before implantation of the third impurity. The third impurity has a concentration gradient along the depth direction. The distribution of the concentration of the third impurity may have a peak at a certain depth from the surface 20*s*. The peak concentration of the third impurity in the depth direction can be, for example, equal to or higher than $1.0\times10^{8}$ $cm^{-3}$ and equal to or lower than $1.0\times10^{20}$ $cm^{-3}$. When the thickness of the second silicon semiconductor layer 24 is 2 μm, the depth of the peak concentration of the third impurity can be, for example, 1.5 μm. Note that, in the distribution of the concentration of the third impurity, the concentration of the third impurity may be relatively high in a certain region in a plane perpendicular to the depth direction while relatively low outside this certain region.

In the example shown in FIG. 2C, ions of the third impurity are implanted across the entire surface 20*s* of the silicon semiconductor layer 20*a*, although the third impurity may be ion-implanted in some parts of the surface 20*s* of the silicon semiconductor layer 20*a*. In such a case, for example, the surface 20*s* of the silicon semiconductor layer 20*a* is covered with a mask layer that has openings in some regions. The third impurity is ion-implanted into the regions that are not covered with the mask layer.

Because the concentration of the ion-implanted third impurity is not uniform along the depth direction, the entirety of the second silicon semiconductor layer 24 is not necessarily inverted to p-type. For the purpose of reducing the concentration gradient along the depth direction, the depth of the third impurity in the silicon semiconductor layer 20*b* may be adjusted by, for example, performing ion implantation with a varying acceleration voltage.

The third impurity can be, for example, one of phosphorus (P) atom, arsenic (As) atom, antimony (Sb) atom, boron (B) atom, and aluminum (Al) atom which can form a semiconductor layer of the second conductivity type that is different from the first conductivity type. When the second conductivity type is p-type, the third impurity can be, for example, boron (B) atom or aluminum (Al) atom. The third impurity is preferably an atom of a lighter weight than the second impurity. In this case, the third impurity can be distributed in a self-organizing manner by Joule heat generated during DPP annealing, which will be described later. When the first conductivity type is n-type and the second conductivity type is p-type, the combination of the second impurity and the third impurity includes examples where the third impurity is B and the second impurity is any of P, As and Sb. When the third impurity is Al, the second impurity is As or Sn. A preferred combination of the second impurity and the third impurity is that the third impurity is B and the second impurity is As or Sb. The atomic weight of B atom as the third impurity is 10.8. Meanwhile, the atomic weights of As atom and Sb atom as the second impurity are 74.9 and 121.8, respectively. The atomic weight of the third impurity is smaller than the atomic weight of the second impurity. As such, DPP annealing is promoted, and the third impurity can be distributed in a self-organizing manner.

Through the above-described process, a semiconductor stack 80 can be provided, which includes the silicon substrate 10 and the silicon semiconductor layer 20*b* that includes the first silicon semiconductor layer 22 and the second silicon semiconductor layer 24.

<Step of Reducing the Thickness of the Silicon Substrate 10>

Figure 2D:
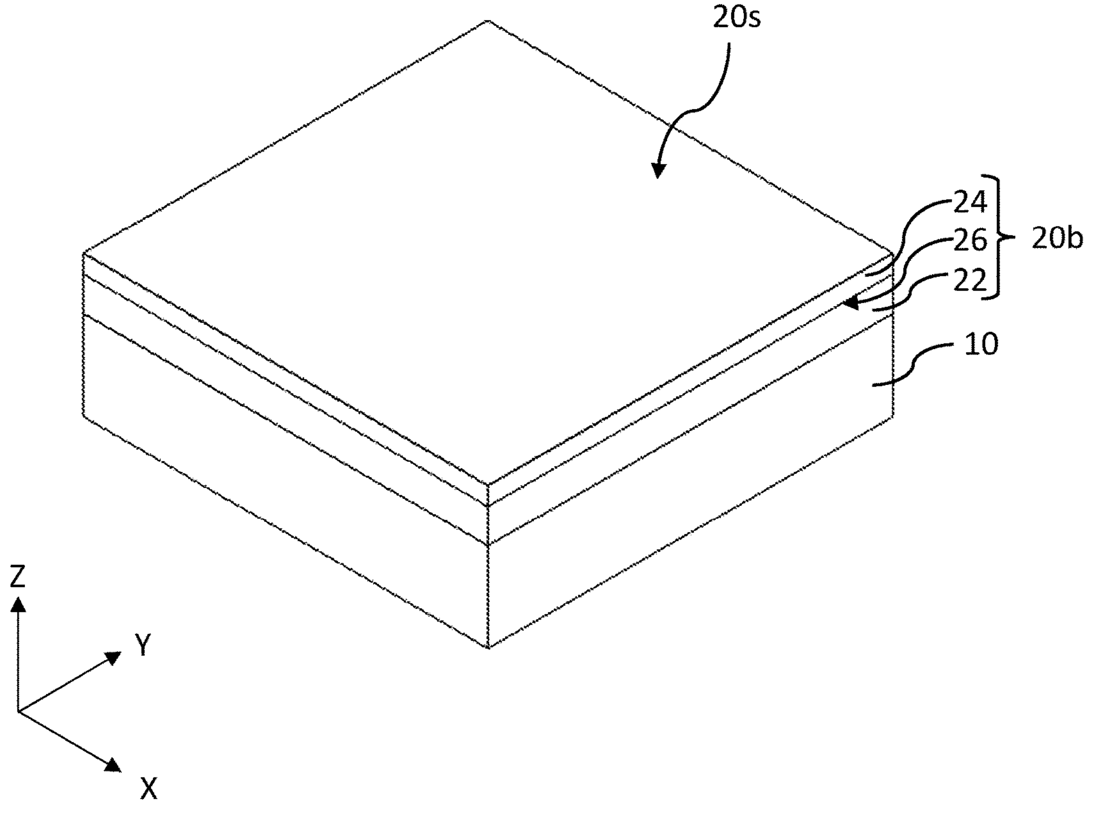
FIG. 2D is a diagram for illustrating an example of a step in a method of manufacturing a semiconductor element according to the present embodiment.

As shown in FIG. 2D, the method may further include the step of reducing the thickness of the silicon substrate 10 before the DPP annealing step, i.e., before the step of irradiating the silicon semiconductor layer 20*b* with light having a predetermined peak wavelength such that the third impurity is diffused. Reducing the thickness of the silicon substrate 10 can contribute to efficiently cooling the silicon substrate 10 heated in DPP annealing. The effects achieved by cooling the silicon substrate 10 will be described later. This step can be performed by, for example, mechanical polishing, chemical mechanical polishing (CMP), or etching. After the thickness reduction step, the thickness of the silicon substrate 10 can be, for example, equal to or greater than 50 μm and equal to or smaller than 300 μm. The step of reducing the thickness of the silicon substrate 10 is not particularly limited so long as it is performed before the DPP annealing step. As will be described later, before processing the silicon substrate 10 so as to reduce its thickness, a first upper electrode 32*b* may be formed on the surface 20*s* of the silicon semiconductor layer 20*b*.

<Step of Forming the First Lower Electrode 32*a* and the First Upper Electrode 32*b*>

Figure 2E:
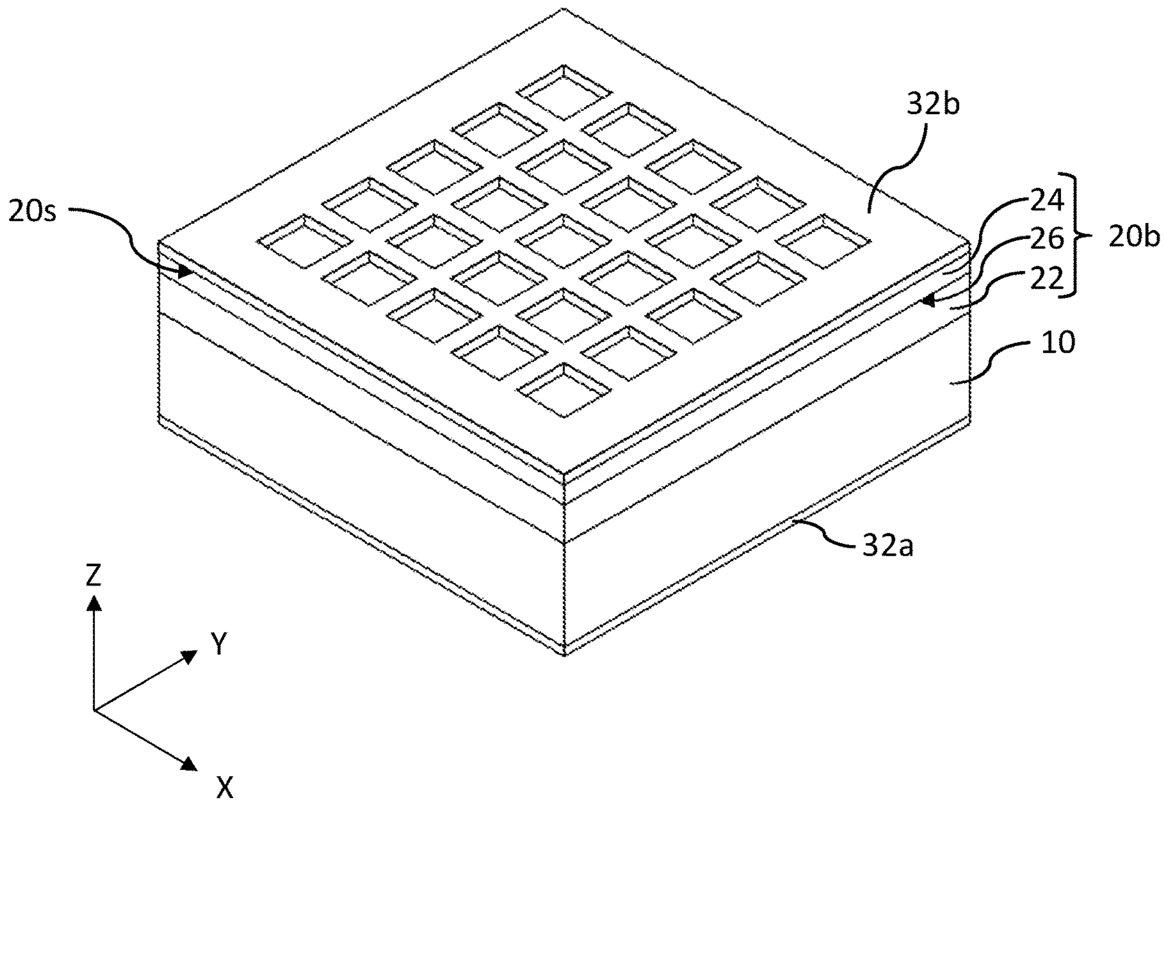
FIG. 2E is a diagram for illustrating an example of a step in a method of manufacturing a semiconductor element according to the present embodiment.

As shown in FIG. 2E, after forming the second silicon semiconductor layer 24 and before the step of irradiating the silicon semiconductor layer 20*b* with light having a predetermined peak wavelength such that the third impurity is diffused, which will be described later, a first upper electrode 32*b*, which has a light-transmitting region capable of transmitting the light having the predetermined peak wavelength, is formed on the surface 20*s* of the silicon semiconductor layer 20*b*. Due to the first upper electrode 32*b*, the irradiation light is transmitted, and an electric current is caused to flow through the silicon substrate 10 and the silicon semiconductor layer 20*b*. Further, a first lower electrode 32*a* is formed on a surface of the silicon substrate 10 opposite to the surface on which the silicon semiconductor layer 20*b* is provided. By forming a high-concentration impurity region in the surface on which the first lower electrode 32*a* is to be formed, the contact resistance between the first lower electrode 32*a* and the surface of the silicon semiconductor layer 20*b* on which the first lower electrode 32*a* is to be formed can be reduced. Further, by forming a high-concentration impurity region in a region in which the first upper electrode 32*b* is to be formed, the contact resistance between the first upper electrode 32*b* and the surface 20*s* of the silicon semiconductor layer 20*b* on which the first upper electrode 32*b* is to be formed can be reduced. For example, at least one of the first lower electrode 32*a* and the first upper electrode 32*b* can be formed of at least one metal selected from the group consisting of Cu, Al, Au and $\lambda_g$. Alternatively, for example, at least one of the first lower electrode 32*a* and the first upper electrode 32*b* can be a light-transmitting electrode that is formed of ITO. Before reducing the thickness of the silicon substrate 10, the first upper electrode 32*b* may be formed on the surface 20*s* of the silicon semiconductor layer 20*b*. As compared with a case where the first upper electrode 32*b* is formed after reducing the thickness of the silicon substrate 10, the first upper electrode 32*b* can be easily formed. Thereafter, the thickness of the silicon substrate 10 is reduced, and the first lower electrode 32*a* may be formed on the thickness-reduced surface of the silicon substrate 10.

The first lower electrode 32*a* can have, for example, a flat-plate shape. The first upper electrode 32*b* can have, for example, a mesh shape. Because the first upper electrode 32*b* has a mesh shape, in the DPP annealing step, which will be described later, an electric current can be efficiently supplied into the silicon semiconductor layer 20*b*, and Joule heat can be generated. The mesh shape includes, for example, a plurality of through holes two-dimensionally arrayed across the surface 20*s*. In DPP annealing, the irradiation light can pass through the plurality of through holes and reach the surface 20*s* of the silicon semiconductor layer 20*b*. The first upper electrode 32*b* has such light-transmitting regions through which the irradiation light can pass. When the first upper electrode 32*b* is, for example, a light-transmitting electrode, the light-transmitting electrode itself has a light-transmitting region and, therefore, the first upper electrode 32*b* is preferably a full-surface electrode that covers the entirety of the surface 20*s*. In the DPP annealing step, the electric current can spread throughout the silicon semiconductor layer 20*b*, and Joule heat can be efficiently generated. In the DPP annealing step, when the silicon semiconductor layer 20*b* is irradiated with light whose peak wavelength is equal to or longer than 1.1 μm and equal to or shorter than 4.0 μm, ITO can be used as the light-transmitting material, and the first upper electrode 32*b* can be used as the full-surface electrode.

<DPP Annealing Step>

Figure 2F:
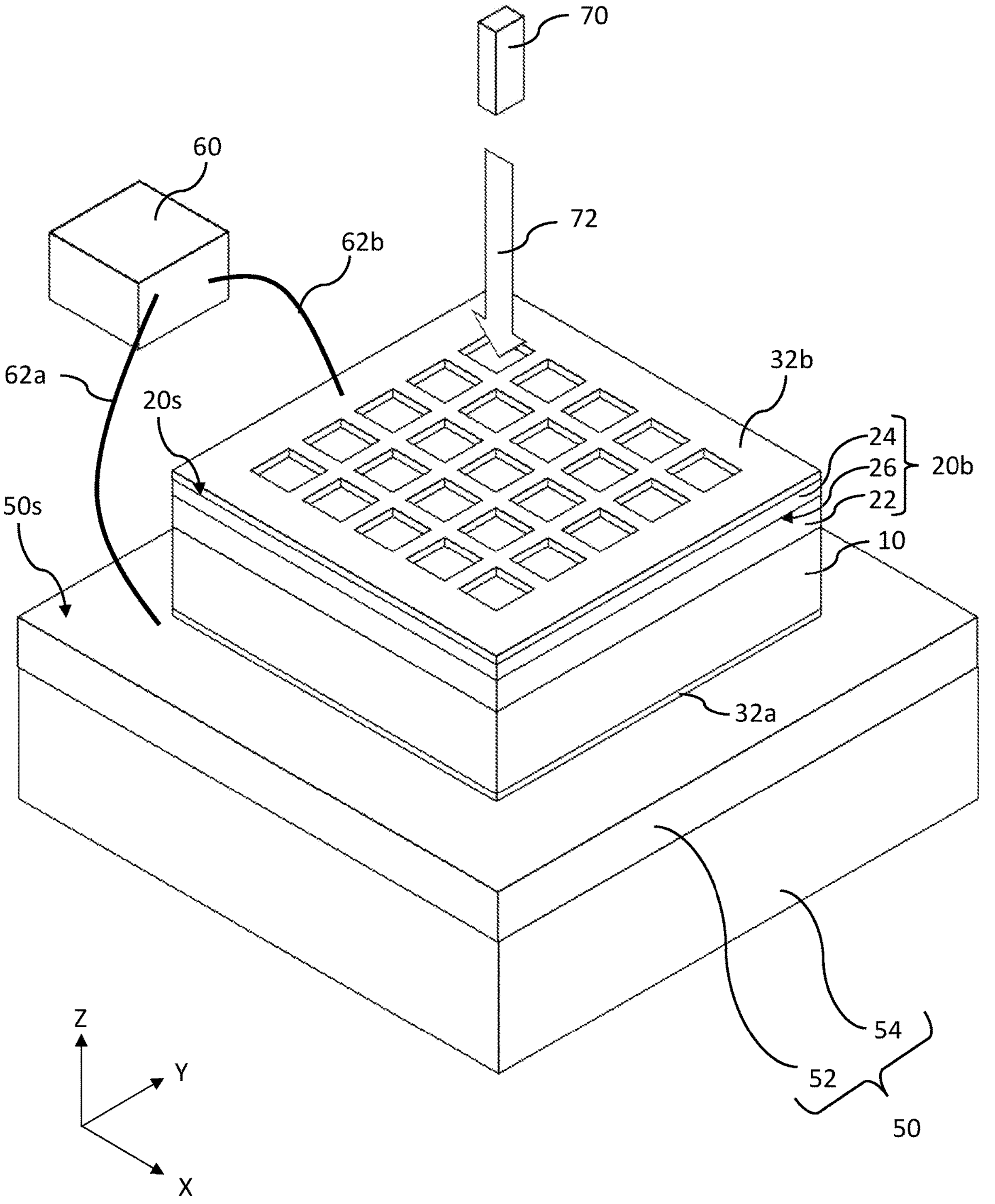
FIG. 2F is a diagram for illustrating an example of a step in a method of manufacturing a semiconductor element according to the present embodiment.

In a subsequent step, as shown in FIG. 2F, DPP annealing is performed. Specifically, the silicon semiconductor layer 20*b* is irradiated with light having a predetermined peak wavelength in the presence of a forward current flowing through the silicon semiconductor layer 20*b* such that the third impurity is diffused. Thereby, Joule heat is concentrated in the first silicon semiconductor layer 22 rather than the silicon substrate 10 such that the third impurity can be distributed in a self-organizing manner. DPP annealing is performed on the silicon semiconductor layer 20*b* while the silicon substrate 10 is located on the surface 50*s* of the heat dissipation plate 50 with the first lower electrode 32*a* interposed therebetween. The heat dissipation plate 50 includes a Peltier element 52 and a heat sink 54. The Peltier element 52 has the surface 50*s* at the upper surface. The Peltier element 52 is provided on the heat sink 54. When an electric current in a particular direction is caused to flow through the Peltier element 52, heat can be transferred from the upper surface to the lower surface of the Peltier element 52. The transferred heat is dissipated to the outside via the heat sink 54.

The first lower electrode 32*a* and the first upper electrode 32*b* are electrically connected to a power supply 60. The power supply 60 has a wire 62*a* and a wire 62*b*, which are electrically connected to the power supply 60. One of the wires, the wire 62*a*, is electrically connected to the surface 50*s* of the Peltier element 52, and the other wire 62*b* is electrically connected to the first upper electrode 32*b*. The power supply 60 applies a voltage between the first lower electrode 32*a* and the first upper electrode 32*b* such that an electric current flows through the silicon substrate 10 and the silicon semiconductor layer 20*b*. The electric current flowing through the silicon semiconductor layer 20*b* is a forward current. The forward current is, for example, a triangular wave current or a pulse current. When the forward current is a triangular wave current, the periodic time can be, for example, equal to or longer than 0.5 second and equal to or shorter than 10 seconds. When the forward current is a pulse current, the periodic time can be, for example, equal to or longer than 1 millisecond and equal to or shorter than 10 milliseconds, and the duty ratio of the energization time to the periodic time can be equal to or higher than 80% and equal to or lower than 98%. The maximum current density can be, for example, equal to or higher than 1.0 A/cm$^2$ and equal to or lower than 100 A/cm$^2$.

When the forward current flows, the light source 70 emits light 72 having a predetermined peak wavelength toward the surface 20*s* of the silicon semiconductor layer 20*b*. The light 72 passing through the plurality of through holes of the first upper electrode 32*b* irradiates the surface 20*s* of the silicon semiconductor layer 20*b*. The predetermined peak wavelength of the light 72 can be, for example, equal to or longer than 1.2 μm and equal to or shorter than 4.0 μm. The output density of the light 72 can be, for example, equal to or higher than 0.5 W/cm$^2$ and equal to or lower than 100 W/cm$^2$. The light 72 is preferably laser light. The full width at half maximum of the spectrum of the laser light is narrower than that of the spectrum of a light-emitting diode, for example. With the laser light, it is easy to control the characteristics of a semiconductor element to be manufactured. DPP annealing is performed at room temperature or lower, for example. The duration of DPP annealing can be, for example, equal to or longer than 10 minutes and equal to or shorter than 2 hours.

When the current is caused to flow, Joule heat generated in the silicon substrate 10 and the silicon semiconductor layer 20*b*. The Joule heat generated in the silicon semiconductor layer 20*b* diffuses the third impurity. By irradiation with the light 72, dressed photons and dressed photon phonons occur at positions of the third impurity. The dressed photons and dressed photon phonons have the uncertainty Δp of the momentum p. Therefore, even with silicon being an indirect transition semiconductor that has momentum mismatch between the highest energy of the valence band and the lowest energy of the conduction band, population inversion resulting from the forward current causes stimulated emission of light at a wavelength corresponding to the peak wavelength of the light 72 in a region including the pn junction 26. The stimulated emission causes the third impurity to lose energy. As compared with a case where the third impurity is diffused only by heat, local cooling resulting from the energy loss caused by the stimulated emission suppresses diffusion of the third impurity. As a result, it is expected that the third impurity forms dopant pairs and can be distributed in a self-organizing manner. Such a region in which the third impurity is distributed corresponds to the near-field light formation region 40 shown in FIG. 1B. Note that this near-field light formation region 40 is formed not only in a region which is irradiated with the light 72 and which includes the pn junction 26 but also in a region which is not irradiated with the light 72 and which includes the pn junction 26. For example, the near-field light formation region 40 may be formed across the entirety of the region including the pn junction 26. This is because, by DPP annealing, as the process of stimulated emission advances, the resultant stimulated emission light propagates inside the silicon semiconductor layer 20*b*.

Because the second concentration of the first silicon semiconductor layer 22 is lower than the first concentration of the silicon substrate 10, the electrical resistivity of the first silicon semiconductor layer 22 can be higher than the electrical resistivity of the silicon substrate 10. As such, in the first silicon semiconductor layer 22, Joule heat can be efficiently generated, while Joule heat generation can be suppressed in the silicon substrate 10. The Joule heat generated in the silicon substrate 10 is smaller than the Joule heat generated in the first silicon semiconductor layer 22 and, therefore, the silicon substrate 10 can be efficiently cooled by the heat dissipation plate 50. Examples of the temperature of the pn junction 26 and the temperature of the silicon substrate 10 in DPP annealing are as follows. In DPP annealing, the temperature of the surface 20*s* of the silicon semiconductor layer 20*b* is equal to or higher than 100° C. and equal to or lower than 200° C. The temperature of the pn junction 26 estimated from this surface temperature is equal to or higher than 400° C. and equal to or lower than 600° C. On the other hand, the temperature of the silicon substrate 10 cooled by the heat dissipation plate 50 is equal to or higher than 0° C. and equal to or lower than 30° C.

When the silicon substrate 10 is not sufficiently cooled, even after the end of DPP annealing, the third impurity continues to diffuse due to the Joule heat generated in the silicon substrate 10, so that the self-organizing distribution of the third impurity is disrupted. On the other hand, in the method of manufacturing the semiconductor element 100 according to the present embodiment, the Joule heat generated in the silicon substrate 10 is smaller than the Joule heat generated in the silicon semiconductor layer 20*b* and, therefore, the silicon substrate 10 is efficiently cooled so that, after the end of DPP annealing, the diffusion of the third impurity can be easily ceased. As a result, the self-organizing distribution of the third impurity can be efficiently realized. The distribution of the impurity can be analyzed by a three-dimensional atom probe. Now, an example of the analysis method is explained. For example, a graph is plotted with the closest neighboring dopant distance on the horizontal axis and the count of dopant pairs at that distance on the vertical axis, and the dopant distribution is examined. The dopant pair refers to a pair of a certain dopant and its closest neighboring dopant. If such an analysis is performed on the DPP-annealed semiconductor element 100, there is a probability that it is possible to confirm that the dopant pairs have a periodic distribution. In the semiconductor element 100 of the present embodiment, the periodic distribution can be a distribution where the period is an integer multiple of the lattice constant of silicon. In this case, the closest neighboring dopant can be ignored. That is, rather than the closest neighboring dopant, the second closest neighboring dopant can be re-defined as the closest neighboring dopant for analysis. Specifically, from the spatial distribution of dopants obtained by the three-dimensional atom probe, the spatial coordinate data of the dopants are omitted at a desired proportion, whereby a new spatial distribution can be created. Note that the dopants to be omitted are randomly selected by random numbers, while the coordinates of the dopants not to be omitted remain at their original coordinates. Subsequently, in the newly created spatial distribution of dopants, the coordinates of the closest neighboring dopant are examined for each dopant, and a graph showing the distribution of the closest neighboring dopant distance can be created. According to such an analysis method, the periodic distribution can be emphasized. For example, if the coordinate information of a dopant are omitted from the periodic distribution, the closest neighboring dopant in a new spatial distribution is a dopant of the next period. If the coordinate information of random dopants adjacent to the periodic distribution are omitted, the closest neighboring dopants in the new spatial distribution are dopants that form the periodic distribution. In contrast, if the coordinates of dopants are omitted from a random distribution, the closest neighboring dopants do not form a periodic structure in the new spatial distribution. Thus, as seen from these points, the periodic distribution can be emphasized by the above-described analysis method.

After DPP annealing, the structure including the silicon substrate 10, the silicon semiconductor layer 20*b*, the first lower electrode 32*a* and the first upper electrode 32*b* is detached from the heat dissipation plate 50.

<Step of Removing the First Lower Electrode 32*a* and the First Upper Electrode 32*b*>

Figure 2G:
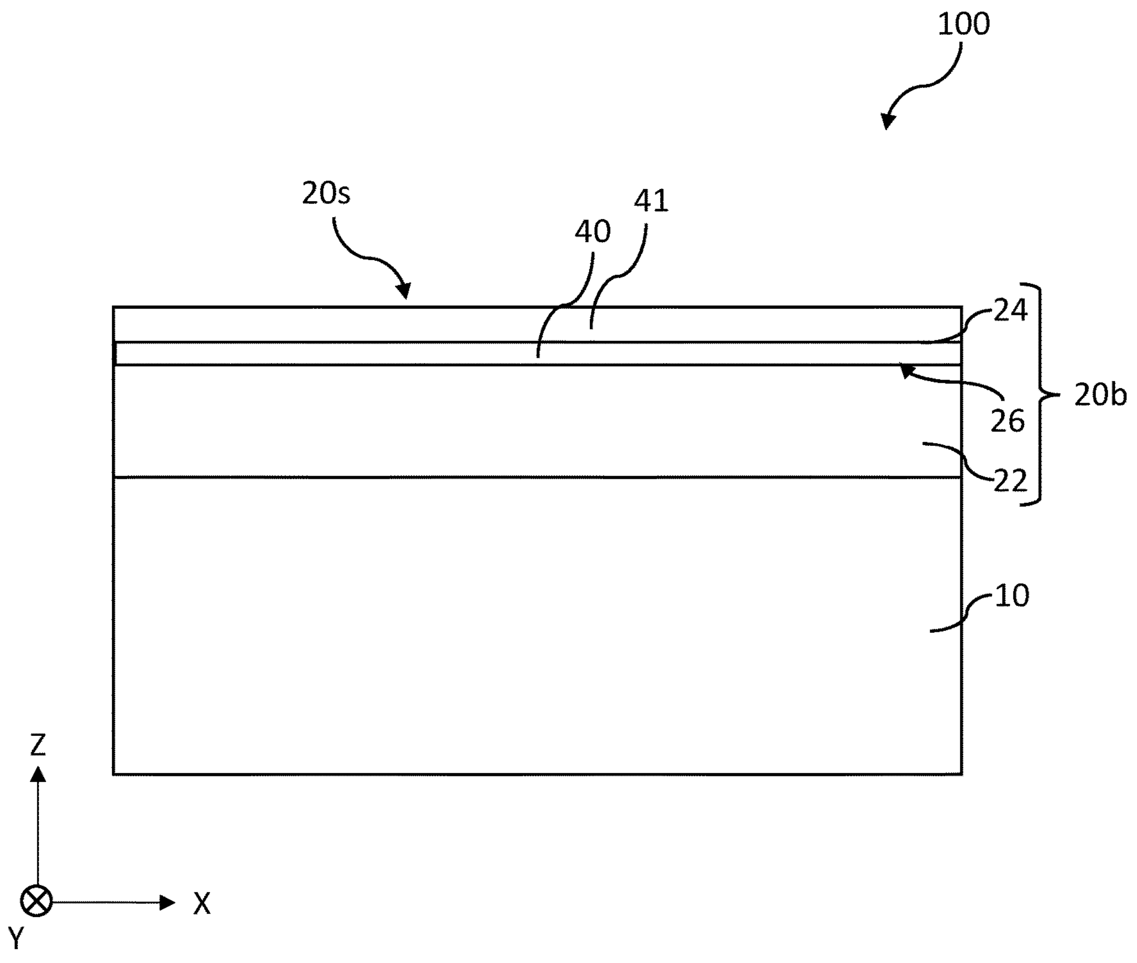
FIG. 2G is a diagram for illustrating an example of a step in a method of manufacturing a semiconductor element according to the present embodiment.
Figure 2H:
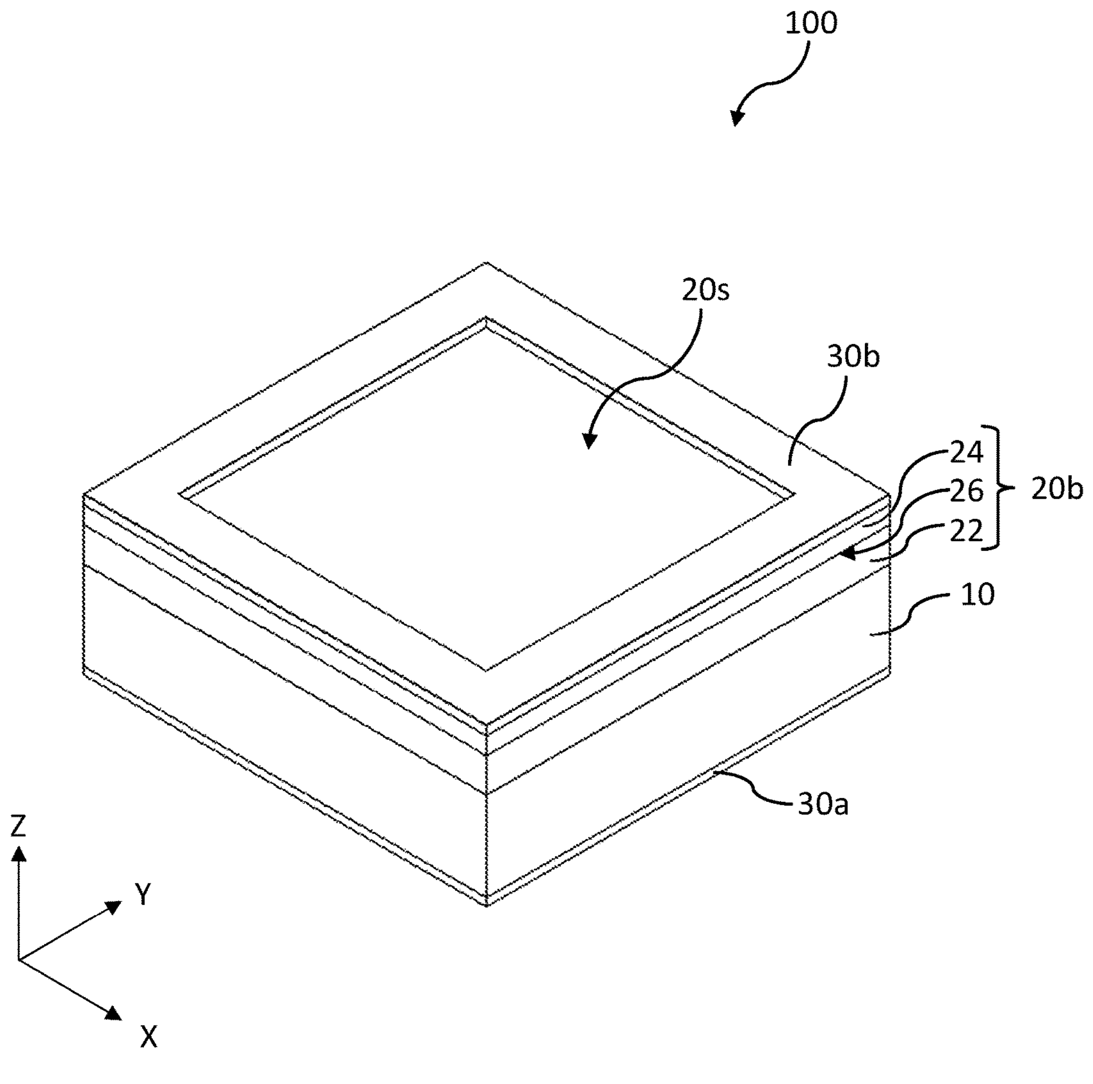
FIG. 2H is a diagram for illustrating an example of a step in a method of manufacturing a semiconductor element according to the present embodiment.

In a subsequent step, the first lower electrode 32*a* and the first upper electrode 32*b* are removed from the above-described structure. FIG. 2G is a cross-sectional view of the structure from which the first lower electrode 32*a* and the first upper electrode 32*b* have been removed. As shown in FIG. 2G, by DPP annealing, the near-field light formation region 40 is formed in a region including the pn junction 26. Removal of the first lower electrode 32*a* and the first upper electrode 32*b* can be realized by, for example, etching.

<Step of Forming the Second Lower Electrode 30*a* and the Second Upper Electrode 30*b*>

In a subsequent step, a second lower electrode 30*a* is formed on a surface of the silicon substrate 10 opposite to the surface on which the silicon semiconductor layer 20*b* has been formed, and a second upper electrode 30*b* having a mesh shape is formed on the surface 20*s* of the silicon semiconductor layer 20*b*. The material of the second lower electrode 30*a* and the second upper electrode 30*b* may be the same as the material of the first lower electrode 32*a* and the material of the first upper electrode 32*b* for DPP annealing. The second lower electrode 30*a* can have, for example, a flat-plate shape. When the second upper electrode 30*b* is formed of a metal, an area of the surface 20*s* on which the second upper electrode 30*b* is not provided is preferably larger than the remaining area of the surface 20*s* on which the second upper electrode 30*b* is provided. This is advantageous for the surface 20*s* in efficiently detecting light as the light receiving surface of a photodetector. This is also advantageous for the surface 20*s* in efficiently emitting light as the light emitting surface of a light-emitting element. When the second upper electrode 30*b* is a light-transmitting electrode such as ITO or the like, the second upper electrode 30*b* can be formed as a full-surface electrode. This is advantageous when it is used as a light-emitting element because the electric current readily spreads. Note that the first lower electrode 32*a* may not be removed and used as the second lower electrode 30*a*. Likewise, the first upper electrode 32*b* may not be removed and used as the second upper electrode 30*b*. Because the first upper electrode 32*b* has a light-transmitting region, light can be detected and emitted via the first upper electrode 32*b*.

Through the process described above with reference to FIG. 2A to FIG. 2H, the semiconductor element 100 of the present embodiment can be manufactured.

In the above-described embodiment, for the sake of simplicity, a portion corresponding to a single semiconductor element is schematically illustrated although, in actuality, a semiconductor wafer in which a plurality of semiconductor element portions have been formed is divided into individual chips, whereby each semiconductor element is manufactured. For example, a semiconductor element is manufactured through the process described below. Note that the aspects that are not specified below are substantially identical to those described in the above-described embodiments.

Firstly, a semiconductor wafer 200, which is a collection of semiconductor element sections 100*a*, is provided. Each of the semiconductor element sections 100*a* includes a silicon substrate 10 and a silicon semiconductor layer 20*b*, and the silicon semiconductor layer 20*b* includes a first silicon semiconductor layer 22, a second silicon semiconductor layer 24 and a pn junction 26. Then, the semiconductor wafer 200 is irradiated with light having a predetermined peak wavelength in the presence of a forward current flowing through the semiconductor wafer 200 such that the third impurity included in the second silicon semiconductor layer 24 is diffused. As a result, a near-field light formation region 40 is formed in a region including the pn junction 26 between the first silicon semiconductor layer 22 and the second silicon semiconductor layer 24. DPP annealing is performed on the entirety of the semiconductor wafer 200. The conditions for DPP annealing may be the same as those of the above-described embodiment.

Figure 2I:
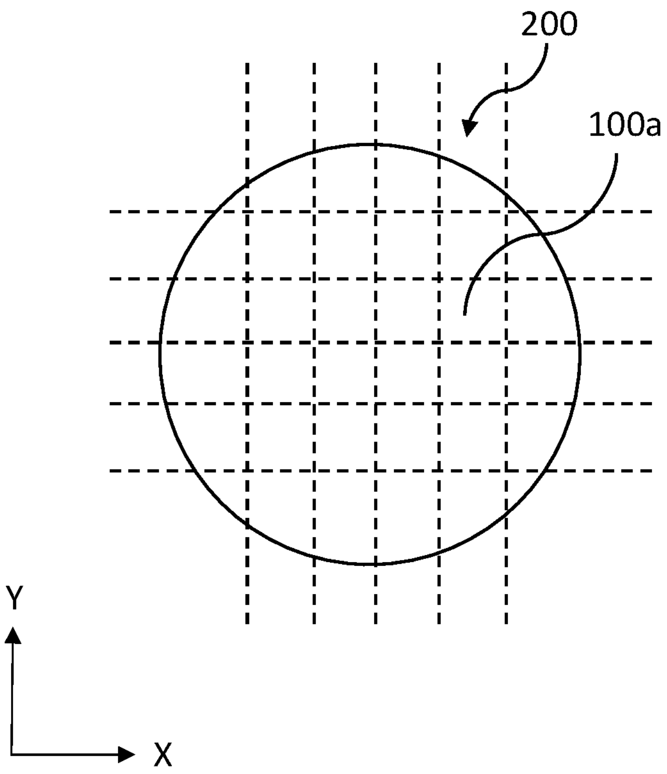
FIG. 2I is a diagram for illustrating the step of dividing into individual chips.

Subsequently, the semiconductor wafer 200 is divided into individual chips. FIG. 2I is a top view of the semiconductor wafer 200. As shown in FIG. 2I, the semiconductor wafer 200 is divided along dashed lines into individual chips. This dividing can be performed by, for example, dicing or laser scribing. The dimensions in X direction and Y direction of the silicon substrate 10 of an individual chip can respectively be, for example, equal to or greater than 100 μm and equal to or smaller than 5000 μm. In this step, the thickness of the silicon substrate 10 can be, for example, equal to or greater than 70 μm and equal to or smaller than 500 μm.

<Operation of the Semiconductor Element as a Device>

The semiconductor element 100 of the present embodiment can operate as at least one device of a light-emitting element, a photodetector and a temperature sensor. First, an example is described where the semiconductor element 100 of the present embodiment is used as a light-emitting element.

<Light-Emitting Element>

First, an example is described where the semiconductor element 100 of the present embodiment is used as a light-emitting element. In the example shown in FIG. 1A, when a voltage is applied between the second lower electrode 30*a* and the second upper electrode 30*b* such that a forward current flows through the silicon semiconductor layer 20*b*, light including the same wavelength as that of the irradiation light applied in DPP annealing is emitted in the vicinity of the pn junction 26 so as to exit via the surface 20*s* of the silicon semiconductor layer 20*b*. If the wavelength of the irradiation light applied in DPP annealing is longer than wavelength $\lambda_g$, light at a wavelength longer than wavelength $\lambda_g$ exits via the surface 20*s* of the silicon semiconductor layer 20*b*. Preferably, the light at a wavelength longer than wavelength $\lambda_g$, which is emitted from the semiconductor element 100, is light having such a peak that the maximum intensity of the emission spectrum occurs at a wavelength substantially equal to the peak wavelength of the irradiation light applied in DPP annealing. Note that the substantially equal wavelength refers to a wavelength whose difference from the peak wavelength of the irradiation light applied in DPP annealing is 50 nm or less. The light at a wavelength longer than wavelength $\lambda_g$ refers to, for example, light whose peak wavelength is equal to or longer than 1.2 μm and equal to or shorter than 4.0 μm. Note that the peak wavelength of the light applied for irradiation may be shorter than 1.1 μm. In this case, a light-emitting element that is capable of emitting blue, green and red light according to the peak wavelength of the light applied for irradiation can be manufactured. So long as the second lower electrode 30*a* is formed of a metal and has a flat-plate shape, the light generated in the vicinity of the pn junction 26 and traveling toward the second lower electrode 30*a* is reflected by the second lower electrode 30*a* and exits via the surface 20*s* of the silicon semiconductor layer 20*b*. As a result, the emission intensity improves.

<Photodetector>

Next, an example is described where the semiconductor element 100 of the present embodiment is used as a photodetector. When light at a wavelength longer than wavelength $\lambda_g$ reaches the near-field light formation region 40 via the surface 20*s* of the silicon semiconductor layer 20*b*, electrons in the vicinity of the pn junction 26 are excited from the valence band to the conduction band. As a result, a photocurrent occurs in the semiconductor element 100. In the example shown in FIG. 1A, the photocurrent can be detected by an ammeter via the second lower electrode 30*a* and the second upper electrode 30*b*. So long as the second lower electrode 30*a* is formed of a metal and has a flat-plate shape, part of the incident light which passes through the pn junction 26 without being absorbed by the pn junction 26 and travels toward the second lower electrode 30*a* can be reflected by the second lower electrode 30*a* so as to again travel toward the pn junction 26 and absorbed in the vicinity of the pn junction 26. As a result, the photosensitivity improves. At zero bias, the semiconductor element 100 of the present embodiment can have photosensitivity of equal to or higher than $2.0\times10^{-6}$ A/W and equal to or lower than $7.0\times10^{-6}$ A/W for light whose peak wavelength is equal to or longer than 1.2 μm and equal to or shorter than 4.0 μm. When a forward voltage of 25 V is applied, the semiconductor element 100 of the present embodiment can have photosensitivity of equal to or higher than $1.0\times10^{-3}$ A/W and equal to or lower than $1.0\times10^{-1}$ A/W for light whose peak wavelength is equal to or longer than 1.2 μm and equal to or shorter than 4.0 μm. The semiconductor element 100 of the present embodiment can operate when, for example, an electric current with the current density of equal to or higher than 10 A/cm$^2$ and equal to or lower than 100 A/cm$^2$, preferably equal to or higher than 10 A/cm$^2$ and equal to or lower than 50 A/cm$^2$, is supplied. Thus, an electric current of high current density can be supplied, so that the photosensitivity can be improved.

Usually, a semiconductor photodetector for detecting the light at a wavelength longer than wavelength $\lambda_g$ is formed of a semiconductor material capable of absorbing such light. Such a semiconductor material can be, for example, InGaAs, of which the energy of the bandgap is lower than the energy of the bandgap of silicon. The energy of the bandgap of InGaAs can be, for example, 0.56 eV or 0.73 eV. The energy of the bandgap of InGaAs depends on the composition ratio of the constituent elements. On the other hand, as the energy of the bandgap decreases, the electrons in the semiconductor are more likely to be thermally excited. The thermally excited electrons form a dark current. When faint light is to be detected, a large dark current will make it difficult to accurately detect a photocurrent. Therefore, when a semiconductor element that is formed of a semiconductor material whose bandgap energy is relatively low is used as a photodetector, the semiconductor element need to be cooled in order to suppress the dark current. In the case of InGaAs, it is cooled to, for example, about −100° C. when used. In contrast, the semiconductor element of the present embodiment, which is formed of silicon, has relatively high bandgap energy, so that a dark current resulting from thermally excited electrons is unlikely to occur. Further, the energy levels of dressed photons and dressed photon phonons are used when light comes in but not used in thermal excitation. Therefore, the semiconductor element of the present embodiment can be used as a photodetector for efficiently detecting the light at a wavelength longer than wavelength $\lambda_g$ at room temperature without the need for cooling.

When the semiconductor element of the present embodiment is used as a photodetector, a forward voltage is applied.

In this case, the photosensitivity can be improved by stimulated emission with the use of dressed photons.

Further, the semiconductor element 100 of the present embodiment is expected to produce the effects described below. The first concentration of the silicon substrate 10 can be, for example, equal to or higher than $1.0\times10^{17}$ $cm^{-3}$ and equal to or lower than $1.0\times10^{21}$ $cm^{-3}$. The electrical resistivity of the silicon substrate 10 can be, for example, equal to or higher than $1.0\times10^{-4}$ Ωcm and equal to or lower than $1\times10^{-1}$ Ωcm. Under these conditions, electrical connection is easily established between the silicon substrate 10 and the electrodes connected to the silicon substrate 10. Therefore, in supplying a predetermined forward current so as to flow through the semiconductor element 100 for driving, the voltage to be applied can be reduced. For example, by applying a voltage equal to or higher than 1 V and equal to or lower than 5.5 V across the semiconductor element 100, a forward current with the current density of 10 $A/cm^2$ can flow through the semiconductor element 100 for driving.

Alternatively, by applying a voltage equal to or higher than 3 V and equal to or lower than 10 V across the semiconductor element 100, a forward current with the current density of 50 $A/cm^2$ can flow through the semiconductor element 100 for driving. In the semiconductor element 100, the voltage applied for causing a predetermined forward current to flow can be reduced irrespective of whether the semiconductor element 100 is used as a light-emitting element or a photodetector.

<Temperature Sensor>

Next, a temperature sensor is described as an application example of the semiconductor element 100 of the present embodiment. In measuring the temperature, for example, the surface 20*s* of the silicon semiconductor layer 20*b* is a temperature measuring surface. The temperature can be measured from the change in differential resistance due to the temperature difference between the temperature of the temperature measuring surface and the temperature of an object under measurement that is in thermal contact with the temperature measuring surface. In the semiconductor element 100 of the present embodiment, the relationship between the differential resistance and the temperature of the semiconductor element 100 can be approximated by considering the differential resistance $R_s$, which is determined by Formula (3) using the differential resistance $R_1$ defined by Formula (1) and the differential resistance $R_2$ defined by Formula (2) as shown below.

[Formula 1]

$$\frac{1}{T} = a + b\cdot\ln(R_1) + c\cdot\ln^3(R_1) \tag{1}$$

In Formula (1), a, b and c are coefficients. Formula (1) is called Steinhart-Hart equation, which represents the relationship between the element temperature T and the differential resistance $R_1$, which is based on a general thermistor theoretical model.

[Formula 2]

$$R_2 = \frac{d}{(T - T_0)^4}\ (T > T_0) \tag{2}$$

In Formula (2), d is a coefficient, and $T_0$ is the temperature of the object under measurement. Formula (2) is determined from Stefan-Boltzmann's law and represents the relationship between the element temperature T and the differential resistance $R_2$ when thermal radiation occurs.

[Formula 3]

$$R_s = \frac{R_1R_2}{R_1 + R_2} \tag{3}$$

Formula (3) represents the parallel resistance of a resistor having the differential resistance $R_1$ defined by Formula (1) and a resistor having the differential resistance $R_2$ defined by Formula (2). Thus, the temperature-dependent change of the differential resistance of the semiconductor element 100 of the present embodiment can be approximated by considering that a resistor defined by Formula (1), which is based on a general thermistor theoretical model, and a resistor defined by Formula (2) which generates thermal radiation at a longer wavelength than wavelength $\lambda_g$ are present together and that parallel electrical connection is established between the second lower electrode 30*a* and the second upper electrode 30*b*. Hereinafter, the operation of the temperature sensor according to the present embodiment is described.

When $T \le T_0$, i.e., when the temperature T of the semiconductor element 100 is equal to or lower than the temperature $T_0$ of the object under measurement, thermal radiation from the temperature measuring surface toward the near-field light formation region 40 occurs. Because the semiconductor element 100 of the present embodiment is capable of receiving the light at a wavelength longer than wavelength $\lambda_g$, part of the thermal radiation at a wavelength longer than wavelength $\lambda_g$ is absorbed in the vicinity of the near-field light formation region 40. The absorption of the thermal radiation excites electrons from the valence band to the conduction band, and the conduction electrons increase. Therefore, the differential resistance in the vicinity of the near-field light formation region 40 changes.

When $T_0 < T$, i.e., when the temperature T of the semiconductor element 100 is higher than the temperature $T_0$ of the object under measurement, thermal radiation from the semiconductor element 100 itself to the outside occurs. Because the semiconductor element 100 of the present embodiment is capable of emitting light at a wavelength longer than wavelength $\lambda_g$, the light at that wavelength is radiated in the form of thermal radiation to the outside. Accordingly, electron-hole pairs disappear. $T_0$ compensate for the electron-hole pairs that have disappeared, electrons and holes are supplied from an external power supply, an electric current flows, and the differential resistance changes.

The temperature-dependent change of the differential resistance of the semiconductor element 100 of the present embodiment is a sharp change when the temperature of the semiconductor element 100 is higher than the temperature of the object under measurement. For example, if the temperature T of the semiconductor element 100 is in the temperature range of equal to or higher than the temperature $T_0$ of the object under measurement and equal to or lower than the temperature $T_0$ of the object under measurement plus 20° C. ($T_0$+20° C.), the absolute value of the change rate of the differential resistance with respect to the temperature of the semiconductor element 100 of the present embodiment will increase as compared with the absolute value of that change rate of usual thermistors. For example, when the temperature of the object under measurement is 25° C., the absolute value of the change rate of the differential resistance of the semiconductor element of the present embodiment with respect to a temperature in the temperature range from 30° C. to 40° C. is for example equal to or greater than 5 Ω/° C. and equal to or smaller than 1000 Ω/° C. This differential resistance is equal to a differential resistance achieved when the voltage is 22 V. Thus, in the above-described temperature range, the semiconductor element of the present embodiment can be used as a temperature sensor having higher sensitivity than usual thermistors, which can be approximated by Formula (1). Further, the absolute value of the change rate of the differential resistance with respect to a temperature in the temperature range from 30° C. to 40° C. is preferably equal to or greater than 5 Ω/° C. and equal to or smaller than 100 Ω/° C., more preferably equal to or greater than 5 Ω/° C. and equal to or smaller than 50 Ω/° C. In this case, the accuracy of temperature measurement can be improved. This temperature sensor can be used as, for example, a contact-type temperature sensor that is capable of measuring the temperature when it comes into contact with the object under measurement. Specifically, in a possible temperature sensor example, the object under measurement and the temperature sensor are brought into contact with each other, and the temperature is measured based on the change in differential resistance.

The differential resistance of the semiconductor element 100 of the present embodiment can be determined as follows. In the example shown in FIG. 1A, when a voltage is applied between the second lower electrode 30*a* and the second upper electrode 30*b*, an electric current flows through the semiconductor element 100. The differential resistance can be calculated from the value of the applied voltage and the value of the electric current. The measurement can be realized by a two-terminal method. If the relationship between the differential resistance and the temperature of the temperature measuring surface is established beforehand, the temperature of the temperature measuring surface can be determined from the calculated differential resistance.

EXAMPLES

Next, an example of a semiconductor element of the present embodiment is described with reference to FIG. 3A to FIG. 4.

Example 1

The semiconductor element of Example 1 includes the components shown in FIG. 1A. The semiconductor element was manufactured through the process described below.

A semiconductor stack was provided. The semiconductor stack included a monocrystalline silicon substrate 10 containing SB atoms (n-type impurity) and a silicon semiconductor layer 20 provided on the monocrystalline silicon substrate 10. The silicon semiconductor layer 20 included the first silicon semiconductor layer 22 containing As atoms (n-type impurity) and the second silicon semiconductor layer 24 containing B atoms (p-type impurity). The semiconductor stack was a semiconductor wafer.

The monocrystalline silicon substrate 10 had a thickness of 625 μm and electrical resistivity of equal to or higher than $7\times10^{-3}$ Ωcm and equal to or lower than $2\times10^{-2}$ Ωcm.

The first silicon semiconductor layer 22 was formed under such conditions that the resultant first silicon semiconductor layer 22 had a thickness of 2 μm and electrical resistivity of 5 Ωcm.

With reference to John C Irvin, "Resistivity of bulk silicon and of diffused layers in silicon" The Bell System Technical Journal, 41, 387 (1962) (hereinafter, referred to as "Irvin curve"), it was estimated that the second concentration of the first silicon semiconductor layer 22, which was estimated from the electrical resistivity, was lower than the first concentration of the silicon substrate.

Ion implantation was performed under such conditions that the second silicon semiconductor layer 24 had a thickness of 2 μm and the third concentration was $5\times10^{15}$ $cm^3$.

Then, this semiconductor stack was polished to a thickness of about 100 μm. Also, the resultant body was divided into individual chips such that the dimensions in X direction and Y direction are each 1000 μm. Thereafter, DPP annealing was performed under the following conditions. The irradiation laser light was continuous wave laser light at the wavelength of 1.32 μm and the power of 1 W. The forward current was a triangular wave current, the periodic time was 2 seconds, and the maximum current value was 1 A. The duration of DPP annealing was 30 minutes. The n-type monocrystalline silicon substrate 10 was cooled by the heat dissipation plate to 15° C.

Comparative Example 1

A semiconductor element of Comparative Example 1 was manufactured through the process described below.

A semiconductor stack was provided. The semiconductor stack included a monocrystalline silicon substrate 10 containing As atoms (n-type impurity) and a second silicon semiconductor layer 24 containing B atoms (p-type impurity). The semiconductor stack was a semiconductor wafer.

The monocrystalline silicon substrate 10 had a thickness of 625 μm and electrical resistivity of 10 Ωcm. In this comparative example, a semiconductor layer corresponding to the first silicon semiconductor layer was not provided.

The second silicon semiconductor layer 24 was formed under the same or similar conditions as those for the second silicon semiconductor layer 24 of Example 1.

Then, this semiconductor stack was polished and divided into individual chips in the same or similar way as Example 1, and DPP annealing was performed under the same or similar conditions as those for Example 1.

Comparative Example 2

A semiconductor element of Comparative Example 2 was manufactured through the process described below.

A semiconductor stack was provided in the same way as Example 1. The semiconductor stack was a semiconductor wafer.

The monocrystalline silicon substrate 10 had a thickness of 625 μm and electrical resistivity of equal to or higher than $7\times10^{-3}$ Ωcm and equal to or lower than $2\times10^{-2}$ Ωcm.

The first silicon semiconductor layer 22 and the second silicon semiconductor layer 24 were formed under the same or similar conditions as those for Example 1. With reference to Irvin curve, it was estimated that the second concentration of the first silicon semiconductor layer 22, which was estimated from the electrical resistivity, was lower than the first concentration of the silicon substrate.

Then, this semiconductor stack was polished and divided into individual chips in the same or similar way as Example 1, and RTA was performed at 1000° C. for 30 seconds. Thereafter, DPP annealing was performed under the following conditions. The irradiation laser light was continuous wave laser light at the wavelength of 1.342 μm and the power of 1 W. The forward current was a pulse current. The periodic time was 5 milliseconds. The duty ratio was 95%.

The maximum current value was 1 A. The duration of DPP annealing was 30 minutes. The n-type monocrystalline silicon substrate 10 was cooled by the heat dissipation plate to 14° C.

Comparative Example 3

A semiconductor element of Comparative Example 3 was manufactured through the process described below.

Firstly, a semiconductor stack was provided. The semiconductor stack included a monocrystalline silicon substrate 10 containing SB atoms (n-type impurity) and a silicon semiconductor layer 20*b* provided on the monocrystalline the silicon substrate 10. The silicon semiconductor layer 20*b* included the first silicon semiconductor layer 22 containing As atoms (n-type impurity) and the second silicon semiconductor layer 24 containing B atoms (p-type impurity). The semiconductor stack was a semiconductor wafer.

The monocrystalline silicon substrate 10 had a thickness of 625 μm and electrical resistivity of equal to or higher than $7\times10^{-3}$ Ωcm and equal to or lower than $2\times10^{-2}$ Ωcm.

The first silicon semiconductor layer 22 was formed under such conditions that the resultant first silicon semiconductor layer 22 had a thickness of 1.5 μm and electrical resistivity of 5 Ωcm. With reference to Irvin curve, it was estimated that the second concentration of the first silicon semiconductor layer 22, which was estimated from the electrical resistivity, was lower than the first concentration of the silicon substrate.

As the second silicon semiconductor layer 24, a p-type semiconductor layer codoped with As atoms and B atoms and a p-type semiconductor layer doped solely with B atoms were formed by CVD. The p-type semiconductor layer codoped with As atoms and B atoms was formed under such conditions that the resultant p-type semiconductor layer had a thickness of 2 μm and the impurity concentration of B atoms was $1\times10^{18}$ $cm^{-3}$. The p-type semiconductor layer doped solely with B atoms was formed under such conditions that the resultant p-type semiconductor layer had a thickness of 1.0 μm and the impurity concentration of B atoms was $1\times10^{19}$ $cm^{-3}$.

Then, this semiconductor stack was polished and divided into individual chips in the same or similar way as Example 1, and DPP annealing was performed under the following conditions. The irradiation laser light was continuous wave laser light at the wavelength of 1.32 μm and the power of 1 W. The forward current was a triangular wave current, and the periodic time was 1 second. The triangular wave currents with the maximum current values of 100 mA, 400 mA and 1000 mA were each caused to flow for 30 minutes. The n-type monocrystalline silicon substrate 10 was cooled to 16° C. by the heat dissipation plate.

<Emission Spectrum>

Figure 3A:
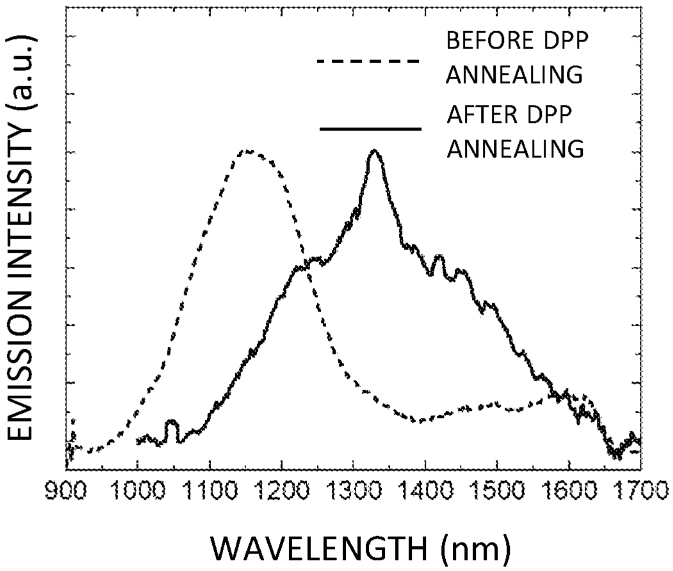
FIG. 3A is a graph showing examples of the emission spectrum of the semiconductor element of Example 1 before and after DPP annealing.

FIG. 3A is a graph showing the emission spectrum of the semiconductor element of Example 1 before and after DPP annealing. In FIG. 3A, the dashed line represents the emission spectrum before DPP annealing, and the solid line represents the emission spectrum after DPP annealing. For the purpose of comparing the peak wavelength between the emission spectra, each of the emission spectra was normalized by the intensity at the peak wavelength. The same applies to FIG. 3B, which will be described later.

As shown in FIG. 3A, by DPP annealing, the emission spectrum was observed in the wavelength range from 1.1 μm to 4.0 μm. The peak wavelength of the emission spectrum after DPP annealing was substantially equal to the wavelength of laser light applied in DPP annealing.

Figure 3B:
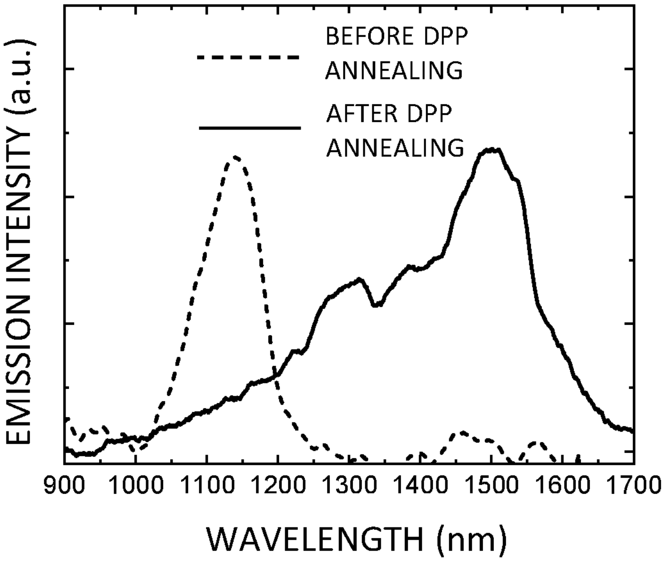
FIG. 3B is a graph showing examples of the emission spectrum of the semiconductor element of Comparative Example 1 before and after DPP annealing.

FIG. 3B is a graph showing the emission spectrum of the semiconductor element of Comparative Example 1 before and after DPP annealing. As shown in FIG. 3B, by DPP annealing, the emission spectrum was observed in the wavelength range from 1.1 μm to 4.0 μm. The difference of the peak wavelength, at which the maximum intensity of the emission spectrum occurred, from the wavelength of the irradiation laser light applied in DPP annealing was greater than 50 nm.

From the results of measurement of the emission spectrum of Example 1 and Comparative Example 1, it was confirmed that the semiconductor element of the present embodiment is driven as a light-emitting element capable of efficiently emitting light at a predetermined wavelength that is longer than wavelength $\lambda_g$.

Figure 3C:
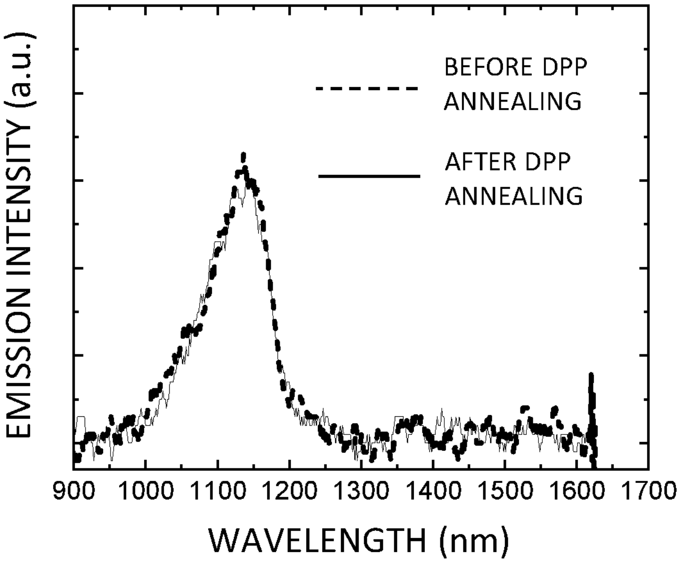
FIG. 3C is a graph showing examples of the emission spectrum of the semiconductor element of Comparative Example 2 before and after DPP annealing.

FIG. 3C is a graph showing examples of the emission spectrum of the semiconductor element of Comparative Example 2 before and after DPP annealing. As shown in FIG. 3C, there was no substantial difference between the peak wavelength of the emission spectrum before DPP annealing and the peak wavelength of the emission spectrum after DPP annealing. B atoms sufficiently activated by RTA are distributed in a stable state. Therefore, it is estimated that, if DPP annealing is performed after RTA, B atoms are not thermally diffused, and a self-organizing distribution of dopant pairs is unlikely to be achieved.

Figure 3D:
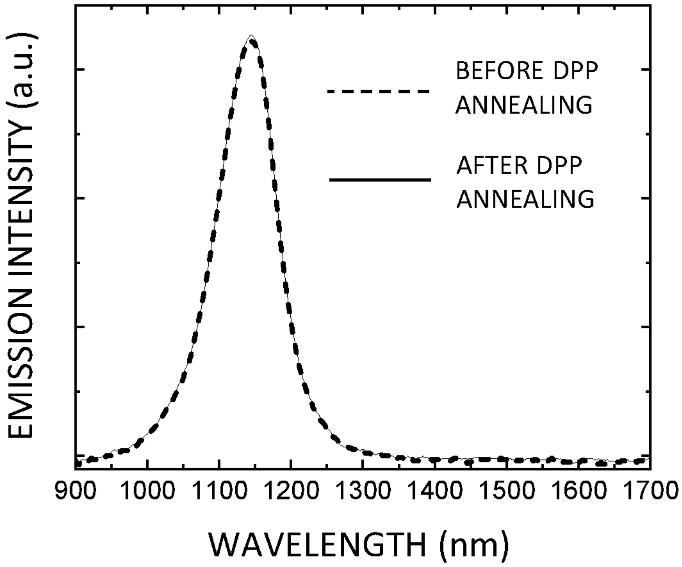
FIG. 3D is a graph showing examples of the emission spectrum of the semiconductor element of Comparative Example 3 before and after DPP annealing.

FIG. 3D is a graph showing examples of the emission spectrum of the semiconductor element of Comparative Example 3 before and after DPP annealing. As shown in FIG. 3D, there was no substantial difference between the peak wavelength of the emission spectrum before DPP annealing and the peak wavelength of the emission spectrum after DPP annealing. This is probably because the heat generated in growing a p-type silicon epitaxial layer by CVD caused RTA to be substantially performed, so that B atoms were distributed in a stable state before DPP annealing. Thus, it is estimated that, even if DPP annealing is performed after the p-type semiconductor layer has been grown by CVD, B atoms are not thermally diffused, and a self-organizing distribution of dopant pairs is unlikely to be achieved.

Example 2

The semiconductor element of Example 2 includes the components shown in FIG. 1. The semiconductor element was manufactured through the process described below.

Firstly, a semiconductor stack was provided in the same or similar way as Example 1. The semiconductor stack was a semiconductor wafer.

The monocrystalline silicon substrate 10 had a thickness of 625 μm and electrical resistivity of equal to or higher than $7\times10^{-3}$ Ωcm and equal to or lower than $2\times10^{-2}$ Ωcm.

The first silicon semiconductor layer 22 was formed under such conditions that the resultant first silicon semiconductor layer 22 had a thickness of 2 μm and electrical resistivity of 5 Ωcm. With reference to Irvin curve, it was estimated that the second concentration of the first silicon semiconductor layer 22, which was estimated from the electrical resistivity, was lower than the first concentration of the silicon substrate.

Ion implantation was performed under such conditions that the second silicon semiconductor layer 24 had a thickness of 2 μm and the third concentration was $1\times10^{19}$ $cm^{3}$.

Then, this semiconductor stack was polished and divided into individual chips in the same or similar way as Example 1, and DPP annealing was performed under the following conditions. The irradiation laser light was continuous wave laser light at the wavelength of 1.32 μm and the power of 1 W. The forward current was a triangular wave current, the periodic time was 2 seconds, and the maximum current value was 1 A. The duration of DPP annealing was 30 minutes. The silicon substrate 10 was cooled to 15° C. by the heat dissipation plate.

Comparative Example 4

As the semiconductor element of Comparative Example 4, a semiconductor element was manufactured under the same or similar conditions as those for Comparative Example 1.

<Photosensitivity>

The photodetectors of Example 2 and Comparative Example 4 were irradiated with light whose peak wavelength is 1.32 μm in the presence of a forward current flowing therethrough, and the photosensitivity was calculated. The results are shown in TABLE 1.

TABLE 1

| | Current Density ($A/cm^2$) | Photosensitivity for light at the wave-length of 1.32 μm (A/W) |
|---|---|---|
| Example 2 | 20 | $7.2 \times 10^{-2}$ |
| Comparative Example 4 | 10 | $3 \times 10^{-2}$ |

When the current density was 20 $A/cm^2$, the photosensitivity of the semiconductor element of Example 2 for light at the wavelength of 1.32 μm was $7.2\times10^{-2}$ (A/W). When the current density was 10 $A/cm^2$, the photosensitivity of the semiconductor element of Comparative Example 4 was $3.6\times10^{-2}$ (A/W). The photosensitivity of the semiconductor element of Example 2 which was achieved when the current density was 20 $A/cm^2$ was higher than the photosensitivity of the semiconductor element of Comparative Example 4 which was achieved when the current density was 10 $A/cm^2$. When, in the semiconductor element of Comparative Example 4, an electric current with the current density of 20 $A/cm^2$ was supplied in measuring the current-voltage characteristic, the semiconductor element of Comparative Example 4 was not driven.

The semiconductor element of Example 2 was irradiated with laser light in the presence of an applied forward voltage of 25 V, and the photosensitivity was calculated. The photosensitivity was calculated at room temperature. When a forward voltage of 25 V was applied to the semiconductor element of Example 2 and an electric current with the current density of 20 $A/cm^2$ was supplied, the electric current was about 200 mA. The photosensitivity was calculated where the increase achieved by the light irradiation from that current value was considered as the photocurrent. The results are shown in TABLE 2.

TABLE 2

| Wavelength (μm) | Photosensitivity (A/W) |
|---|---|
| 1.32 | $7.2 \times 10^{-2}$ |
| 1.55 | $1.3 \times 10^{-2}$ |
| 1.99 | $2 \times 10^{-3}$ |

As shown in TABLE 2, when the wavelength of the irradiation laser light was 1.32 μm, the photosensitivity of the semiconductor element of Example 2 was equal to or higher than $1.0\times10^{-3}$ A/W and equal to or lower than $1.0\times10^{-1}$ A/W. When the wavelength of the irradiation laser light was 1.55 μm, the photosensitivity of the semiconductor element of Example 2 was about $1.3\times10^{-2}$ A/W. When the wavelength of the irradiation laser light was 1.99 μm, the photosensitivity of the semiconductor element of Example 2 was about $2\times10^{-3}$ A/W. Due to application of a forward voltage, the photosensitivity of the semiconductor element of Example 2 was also effective for light at a wavelength equal to or longer than the wavelength of the laser light applied in DPP annealing.

At zero bias, the semiconductor element of Example 2 was irradiated with laser light having a peak wavelength of 1.32 μm, and the photosensitivity was calculated. The photosensitivity was measured at room temperature before and after DPP annealing. The results are shown in TABLE 3.

TABLE 3

| Measurement of photosensitivity | Photosensitivity (A/W) |
|---|---|
| before DPP annealing | $1.6 \times 10^{-6}$ |
| after DPP annealing | $5.8 \times 10^{-6}$ |

As shown in TABLE 3, it was confirmed that, at zero bias, the photosensitivity of the semiconductor element of Example 2 for light at the wavelength of 1.32 μm was higher after DPP annealing than before DPP annealing.

<Temperature-Dependent Change of Differential Resistance>

Next, an example of the semiconductor element of the present embodiment as a temperature sensor is described. The semiconductor element of Example 3 had the same or similar configuration as the semiconductor element of Example 2. The semiconductor element of Example 3 was placed on a Peltier element, and the temperature of the semiconductor element of Example 3 was varied by heating or cooling by the Peltier element. The differential resistance was determined from the voltage value and the current value at each temperature. The surface 20*s* of the silicon semiconductor layer 20*b*, which was the temperature measuring surface, was in contact with the atmosphere, and the temperature of the object under measurement (atmosphere) was 25° C. FIG. 4 is a graph showing the relationship between the temperature and the differential resistance in the semiconductor element of Example 3 when the temperature of the object under measurement was 25° C. The differential resistance is a differential resistance determined when the voltage was 22 V. The temperature shown in FIG. 4 is the temperature of the Peltier element. In FIG. 4, the differential resistance is shown in logarithmic form. In FIG. 4, solid boxes represent the measurement results. The dotted chain line shown in FIG. 4 represents the relationship between the temperature and the differential resistance, which is based on a general thermistor theoretical model defined by Formula (1). The dashed line shown in FIG. 4 represents the relationship between the temperature and the differential resistance which is defined by Formula (3).

Figure 4:
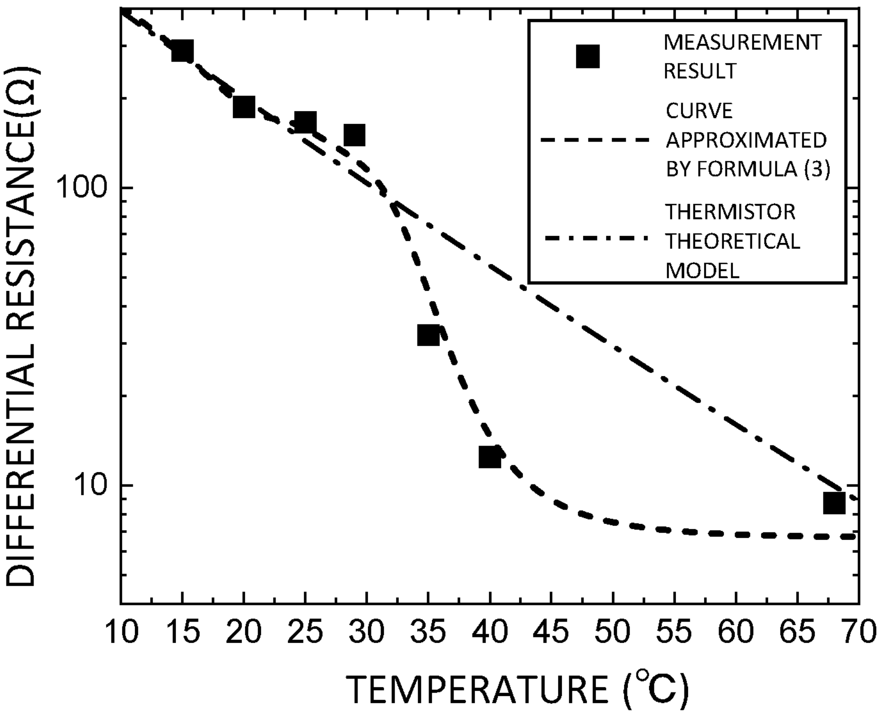
FIG. 4 is a graph showing the relationship between the temperature and the differential resistance in the semiconductor element of Example 3 at the ambient temperature of 25° C.

As shown in FIG. 4, it was confirmed that the relationship between the differential resistance and the temperature in the semiconductor element of Example 3 behaves like the dashed line defined by Formula (3). Further, in the semiconductor element of Example 3, the absolute value of the change rate of the differential resistance with respect to a temperature in the temperature range from 30° C. to 40° C.

was 10 Ω/° C., which was greater than the absolute value of that rate determined from Formula (1).

<Driving Voltage>

Through a semiconductor element manufactured under the same or similar conditions as those for Example 1 and Comparative Example 1, a forward current (mA) is caused to flow. The forward current caused to flow for the purpose of driving the semiconductor element, the current density, and the voltage are shown below.

TABLE 4

| | Forward current (mA) | Current density (A/cm$^2$) | Voltage (V) |
|---|---|---|---|
| Example 1 | 100 | 10 | 5 |
| | 500 | 50 | 6.5 |
| Comparative | 100 | 10 | 37 |
| Example 1 | 500 | 50 | — |

As shown in TABLE 4, in both cases where the current density of the forward current caused to flow was 10 A/cm$^2$ and 50 A/cm$^2$, the voltage applied to the semiconductor element of Example 1 was small as compared with the semiconductor element of Comparative Example 1. As previously described, the semiconductor element of Comparative Example 4, which was manufactured through the same or similar process as Comparative Example 1, was not driven when an electric current with the current density of 20 A/cm$^2$ was supplied. Therefore, in this semiconductor element that was manufactured under the same or similar conditions as those for Comparative Example 1, measurement with the current density of 50 A/cm$^2$ was not performed.

<Three-Dimensional Atom Probe>

Figure 5A:
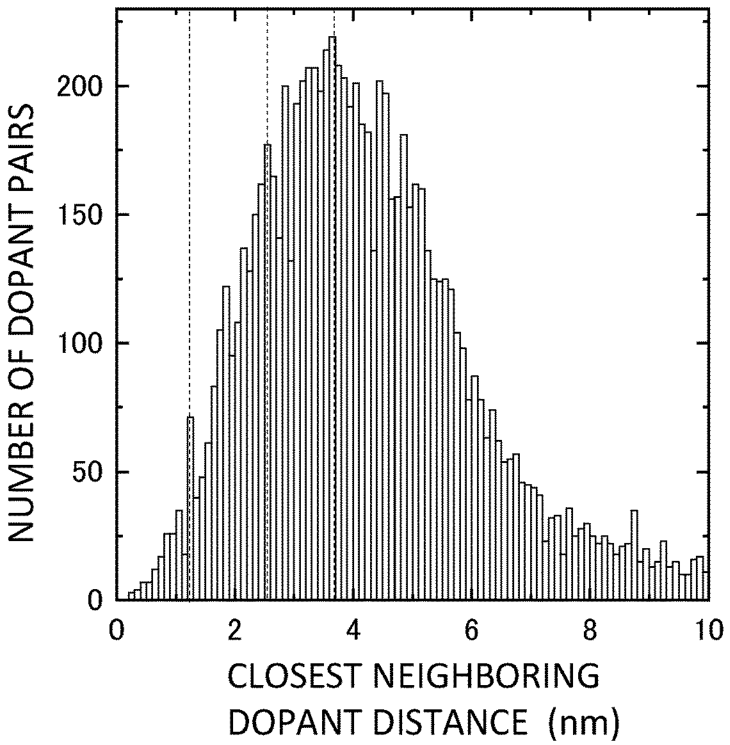
FIG. 5A is a graph showing the distribution of the closest neighboring dopant distance.
Figure 5B:
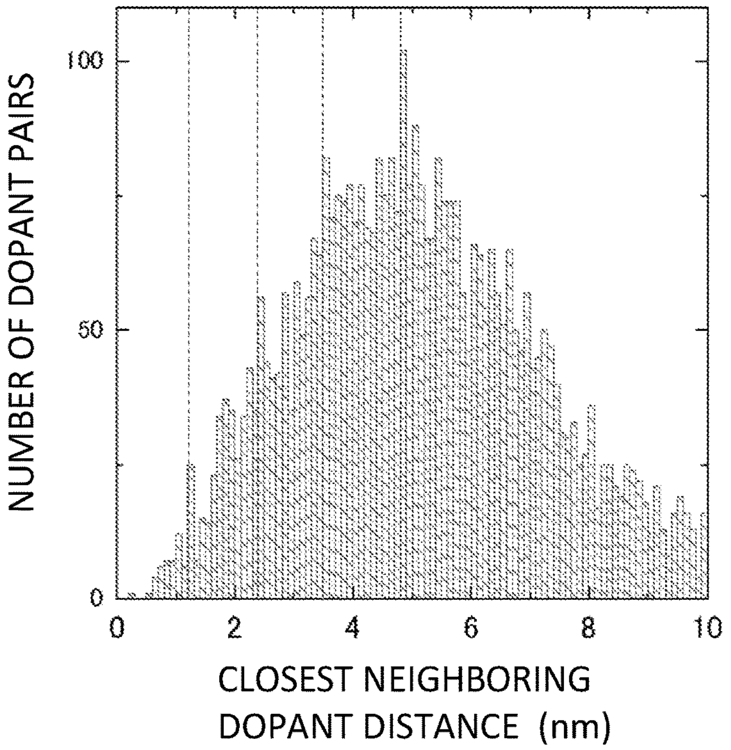
FIG. 5B is another graph showing the distribution of the closest neighboring dopant distance.

On a semiconductor element manufactured under the same or similar conditions as those for Example 2, a three-dimensional atom probe was performed. FIG. 5A is a graph showing the distribution of the closest neighboring dopant distance, which was obtained by determining the coordinates of the closest neighboring dopant of each dopant in a spatial distribution of dopants obtained by the three-dimensional atom probe. The graph of FIG. 5A was obtained as follows. Firstly, from the spatial distribution of dopants obtained by the three-dimensional atom probe, the data of the spatial coordinates of a half of the dopants were omitted, whereby a new spatial distribution was created. The dopants to be omitted were randomly selected by random numbers, while the coordinates of the dopants not to be omitted remained at their original coordinates. Subsequently, in the newly created spatial distribution of dopants, the coordinates of the closest neighboring dopant were examined for each dopant, and a graph showing the distribution of the closest neighboring dopant distance was created, which is the graph of FIG. 5B. In FIG. 5B, dashed lines were drawn at the positions of the closest neighboring dopant distance which were considered to be peaks. Also, in FIG. 5A, dashed lines were drawn at similar positions as in FIG. 5B. In FIG. 5B, the peak structure was emphasized as compared with FIG. 5A. The interval of the dashed lines drawn in FIG. 5A and FIG. 5B was about several times the lattice constant of silicon. This result suggests the presence of a periodic distribution of dopant pairs.

A semiconductor element manufacturing method and a semiconductor element of the present disclosure are applicable to devices, such as photodetectors, light-emitting elements, or temperature sensors.

The invention claimed is:

1. A method of manufacturing a semiconductor element, the method comprising:

providing a semiconductor stack comprising:

a silicon substrate containing a first impurity of a first conductivity type that is one of p-type and n-type, at a first concentration, and a silicon semiconductor layer provided on the silicon substrate, the silicon semiconductor layer comprising:

a first silicon semiconductor layer containing a second impurity of the first conductivity type at a second concentration that is lower than the first concentration, and a second silicon semiconductor layer containing a third impurity of a second conductivity type that is the other of p-type and n-type;

after providing the semiconductor stack, forming a first upper electrode on a surface of the silicon semiconductor layer, the first upper electrode comprising a light-transmitting region configured to transmit light having the predetermined peak wavelength that is longer than a wavelength corresponding to a magnitude of a bandgap of silicon;

after forming the first upper electrode, irradiating the silicon semiconductor layer with light having a predetermined peak wavelength in a presence of a forward current flowing through the silicon semiconductor layer such that the third impurity is diffused;

removing the first upper electrode; and forming a second upper electrode for use in operation of the semiconductor element on a part of the surface of the silicon semiconductor layer.

2. The method of claim 1, wherein:

providing the semiconductor stack comprises:

forming the silicon semiconductor layer on the silicon substrate, the silicon semiconductor layer comprising the first silicon semiconductor layer containing a second impurity of the first conductivity type at a second concentration that is lower than the first concentration, and introducing, into a surface of the silicon semiconductor layer, a third impurity of a second conductivity type that is the other of p-type and n-type, thereby forming the second silicon semiconductor layer.

3. The method of claim 1, further comprising:

reducing a thickness of the silicon substrate before irradiating the silicon semiconductor layer with the light having the predetermined peak wavelength such that the third impurity is diffused.

4. The method of claim 2, further comprising:

reducing a thickness of the silicon substrate before irradiating the silicon semiconductor layer with the light having the predetermined peak wavelength such that the third impurity is diffused.

5. The method of claim 1, wherein:

the irradiating of the silicon semiconductor layer with the light having the predetermined peak wavelength comprises irradiating the silicon semiconductor layer with the light having the predetermined peak wavelength in the presence of the forward current flowing through the silicon semiconductor layer while the silicon substrate is located on a heat dissipation plate.

6. The method of claim 2, wherein:

the irradiating of the silicon semiconductor layer with the light having the predetermined peak wavelength comprises irradiating the silicon semiconductor layer with the light having the predetermined peak wavelength in the presence of the forward current flowing through the silicon semiconductor layer while the silicon substrate is located on a heat dissipation plate.

7. The method of claim 1, wherein:

the first concentration is equal to or higher than $1\times10^{17}$ $cm^{-3}$ and equal to or lower than $1\times10^{21}$ $cm^{-3}$, and the second concentration is equal to or higher than $1\times10^{14}$ $cm^{-3}$ and equal to or lower than $1\times10^{16}$ $cm^{-3}$.

8. The method of claim 4, wherein:

the first concentration is equal to or higher than $1\times10^{17}$ $cm^{-3}$ and equal to or lower than $1>10^{21}$ $cm^{-3}$, and the second concentration is equal to or higher than $1\times10^{14}$ $cm^{-3}$ and equal to or lower than $1\times10^{16}$ $cm^{-3}$.

9. The method of claim 8, comprising:

after forming the second silicon semiconductor layer and before irradiating the silicon semiconductor layer with the light having the predetermined peak wavelength, forming a first upper electrode on a surface of the silicon semiconductor layer, the first upper electrode comprising a light-transmitting region configured to transmit the light having the predetermined peak wavelength.

10. The method of claim 1, wherein:

the semiconductor element is a semiconductor photodetector or a semiconductor light-emitting element.

11. The method of claim 1, wherein:

in irradiating the silicon semiconductor layer with the light having the predetermined peak wavelength, while the silicon substrate is located on a heat dissipation plate, a temperature of a surface of the silicon semiconductor layer is equal to or higher than 100° C. and equal to or lower than 200° C., and a temperature of the silicon substrate cooled by the heat dissipation plate is equal to or higher than 0° C. and equal to or lower than 30° C.

12. A method of manufacturing a semiconductor element, the method comprising:

providing a semiconductor stack comprising:

a silicon substrate containing a first impurity of a first conductivity type that is one of p-type and n-type, at a first concentration, and a silicon semiconductor layer provided on the silicon substrate, the silicon semiconductor layer comprising:

a first silicon semiconductor layer containing a second impurity of the first conductivity type at a second concentration that is lower than the first concentration, and a second silicon semiconductor layer containing a third impurity of a second conductivity type that is the other of p-type and n-type; and irradiating the silicon semiconductor layer with light having a predetermined peak wavelength in a presence of a forward current flowing through the silicon semiconductor layer such that the third impurity is diffused; wherein:

in irradiating the silicon semiconductor layer with the light having the predetermined peak wavelength, while the silicon substrate is located on a heat dissipation plate, a temperature of a surface of the silicon semiconductor layer is equal to or higher than 100° C. and equal to or lower than 200° C., and a temperature of the silicon substrate cooled by the heat dissipation plate is equal to or higher than 0° C. and equal to or lower than 30° C.

13. A method of manufacturing a semiconductor element, the method comprising:

providing a semiconductor stack comprising:

a silicon substrate containing a first impurity of a first conductivity type that is one of p-type and n-type, at a first concentration, and a silicon semiconductor layer provided on the silicon substrate, the silicon semiconductor layer comprising:

a first silicon semiconductor layer containing a second impurity of the first conductivity type at a second concentration that is lower than the first concentration, and a second silicon semiconductor layer containing a third impurity of a second conductivity type that is the other of p-type and n-type; and irradiating the silicon semiconductor layer with light having a predetermined peak wavelength in a presence of a forward current flowing through the silicon semiconductor layer such that the third impurity is diffused; wherein:

the predetermined peak wavelength is longer than a wavelength corresponding to a magnitude of a bandgap of silicon; and in irradiating the silicon semiconductor layer with the light having the predetermined peak wavelength, while the silicon substrate is located on a heat dissipation plate, a temperature of a surface of the silicon semiconductor layer is equal to or higher than 100° C. and equal to or lower than 200° C., and a temperature of the silicon substrate cooled by the heat dissipation plate is equal to or higher than 0° C. and equal to or lower than 30° C.

* * * * *